US011469172B2

(12) United States Patent
Gwon et al.

(10) Patent No.: US 11,469,172 B2
(45) Date of Patent: Oct. 11, 2022

(54) SEMICONDUCTOR DEVICES

(71) Applicant: Samsung Electronics Co., Ltd., Suwon-si (KR)

(72) Inventors: Taemok Gwon, Seoul (KR); Junhyoung Kim, Seoul (KR); Chadong Yeo, Suwon-si (KR); Youngbum Woo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/060,851

(22) Filed: Oct. 1, 2020

(65) Prior Publication Data

US 2021/0287986 A1    Sep. 16, 2021

(30) Foreign Application Priority Data

Mar. 13, 2020 (KR) .................. 10-2020-0031455

(51) Int. Cl.
*H01L 23/48* (2006.01)
*H01L 23/522* (2006.01)
(Continued)

(52) U.S. Cl.
CPC .... *H01L 23/5226* (2013.01); *H01L 23/53209* (2013.01); *H01L 23/53295* (2013.01); *H01L 29/1033* (2013.01)

(58) Field of Classification Search
CPC . H01L 23/522; H01L 23/532; H01L 23/5226; H01L 23/53209; H01L 23/53271; H01L 23/53295; H01L 29/10; H01L 29/1033; H01L 27/115; H01L 27/11551; H01L 27/11578; H01L 27/11556; H01L 27/11573; H01L 27/11575; H01L 27/11595; H01L 27/11592; H01L 27/11512; H01L 27/11509; H01L 27/11529; H01L 27/11524;
(Continued)

(56) References Cited

U.S. PATENT DOCUMENTS 9,431,415 B2    8/2016 Shin et al.
9,831,260 B2    11/2017 Zhang et al.
(Continued)

OTHER PUBLICATIONS

Zusing Yang, et al. "Reduction of Wafer Arcing during High Aspect Ratio Etching", ASMC 2017.

*Primary Examiner* — Chuong A Luu
(74) *Attorney, Agent, or Firm* — Muir Patent Law, PLLC

(57) ABSTRACT

A semiconductor device includes a first substrate, circuit devices disposed on the first substrate, a first interconnection structure electrically connected to the circuit devices, a second substrate disposed on an upper portion of the first interconnection structure, gate electrodes spaced apart from each other and stacked on the second substrate in a direction perpendicular to an upper surface of the second substrate, and channel structures penetrating the gate electrodes, extending perpendicularly to the second substrate, and including a channel layer. The semiconductor device also includes a ground interconnection structure connecting the first substrate and the second substrate, and including an upper via integrated with the second substrate and extending from a lower surface of the second substrate towards the first substrate.

26 Claims, 19 Drawing Sheets

(51) Int. Cl.
*H01L 23/532* (2006.01)
*H01L 29/10* (2006.01)

(58) Field of Classification Search
CPC ......... H01L 27/11548; H01L 27/11526; H01L 27/10897; H01L 27/10894; H01L 27/1116; H01L 45/1273; H01L 45/1253
USPC .......................................................... 257/774
See application file for complete search history.

(56) References Cited

U.S. PATENT DOCUMENTS

| | | |
|---|---|---|
| 9,875,931 B2 | 1/2018 | Lee et al. |
| 10,355,013 B2 | 7/2019 | Shim et al. |
| 10,381,373 B2 | 8/2019 | Okizumi et al. |
| 2009/0308734 A1 | 12/2009 | Krauss |
| 2015/0129878 A1* | 5/2015 | Shin .................. H01L 29/66833 257/66 |
| 2017/0133398 A1* | 5/2017 | Son ........................ G11C 16/26 |
| 2019/0198524 A1 | 6/2019 | Fujiki et al. |
| 2019/0326309 A1 | 10/2019 | Nagashima et al. |

* cited by examiner

SEMICONDUCTOR DEVICES

CROSS-REFERENCE TO RELATED APPLICATION(S)

This application claims benefit of priority to Korean Patent Application No. 10-2020-0031455 filed on Mar. 13, 2020 in the Korean Intellectual Property Office, the disclosure of which is incorporated herein by reference in its entirety.

BACKGROUND

Example embodiments of the present inventive concept relate to a semiconductor device.

A semiconductor device has been required to have a reduced volume and to process high capacity data. Accordingly, it may be necessary to increase integration density of a semiconductor element constituting such a semiconductor device. Accordingly, as one method for improving integration density of a semiconductor device, a semiconductor device having a vertical transistor structure, instead of a planar transistor structure, has been suggested.

SUMMARY

An example embodiment of the present inventive concept is to provide a semiconductor device having improved reliability.

According to example embodiments, a semiconductor device includes a peripheral circuit region including a first substrate, circuit devices provided on the first substrate, and a first interconnection structure electrically connected to the circuit devices, a memory cell region including a second substrate disposed on an upper portion of the first substrate and having a first region and a second region, gate electrodes spaced apart from each other and stacked in a first direction perpendicular to an upper surface of the second substrate in the first region and extending while having a staircase form in a second direction perpendicular to the first direction in the second region, interlayer insulating layers alternately stacked with the gate electrodes, channel structures penetrating the gate electrodes, extending perpendicularly to the second substrate, and including a channel layer, and a second interconnection structure electrically connected to the gate electrodes and the channel structures, and a third interconnection structure connecting the first substrate and the second substrate, the third interconnection structure including an upper via extending from the second substrate and including a material the same as that of the second substrate, and a lower interconnection structure connected to a lower portion of the upper via and having a structure corresponding to the first interconnection structure.

According to example embodiments, a semiconductor device includes a first substrate, circuit devices disposed on the first substrate, a first interconnection structure electrically connected to the circuit devices, a second substrate disposed on an upper portion of the first interconnection structure, gate electrodes spaced apart from each other and stacked on the second substrate in a direction perpendicular to an upper surface of the second substrate, channel structures penetrating the gate electrodes, extending perpendicularly to the second substrate, and including a channel layer, and a ground interconnection structure connecting the first substrate and the second substrate, and including an upper via integrated with the second substrate and extending from a lower surface of the second substrate towards the first substrate.

According to example embodiments, a semiconductor device includes a first region including a first substrate, circuit devices provided on the first substrate, and a first interconnection structure electrically connected to the circuit devices, a second region including a second substrate disposed on an upper portion of the first substrate and including a semiconductor material, gate electrodes spaced apart from each other and stacked on the second substrate in a direction perpendicular to an upper surface of the second substrate, channel structures penetrating the gate electrodes, extending perpendicularly to the second substrate, and including a channel layer, and a second interconnection structure electrically connected to the gate electrodes and the channel structures, and a third interconnection structure connecting the first substrate and the second substrate, and including an upper via integrated with the second substrate and a metal structure connected to the upper via.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1A:
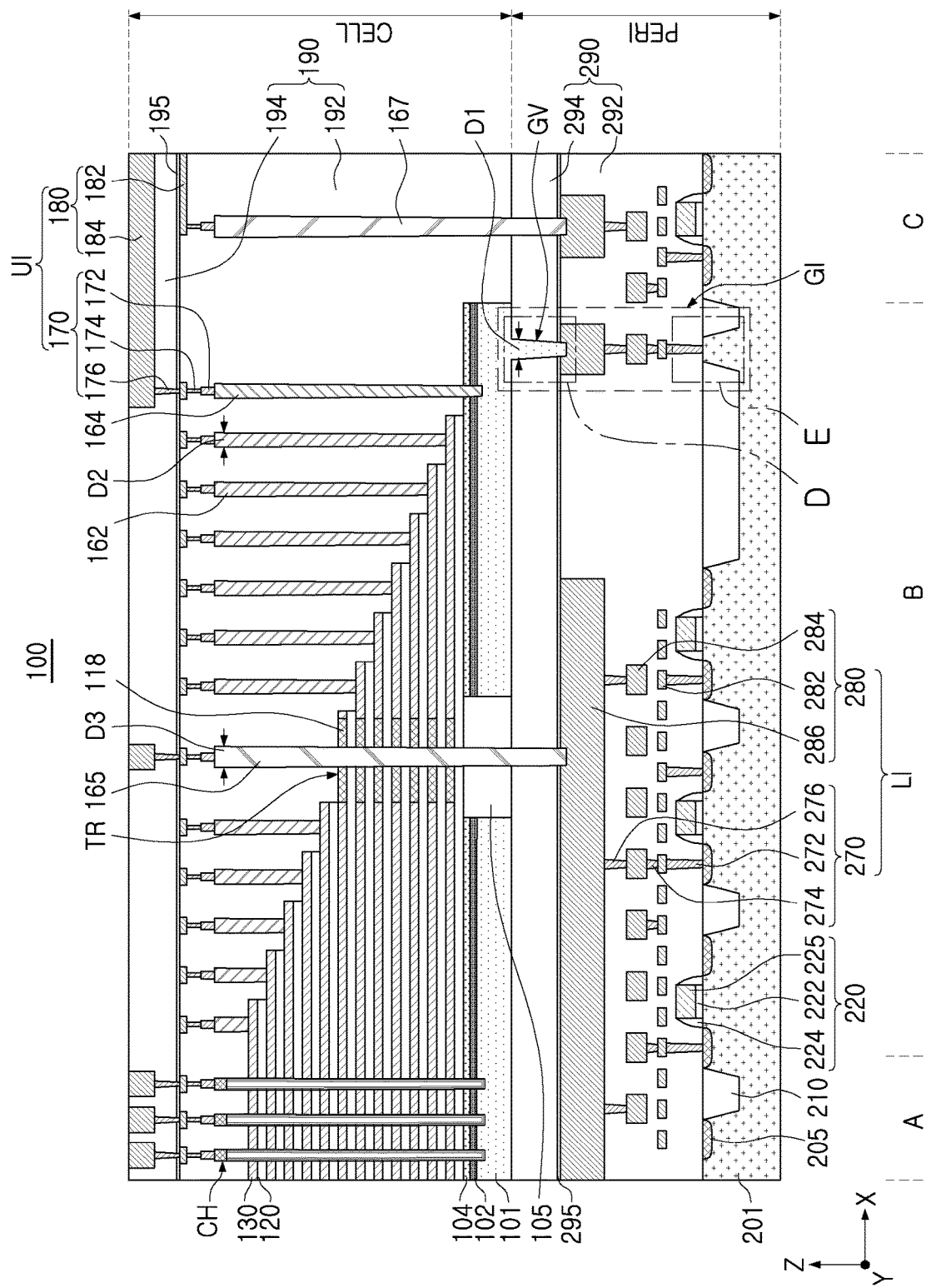
FIGS. 1A and 1B are schematic cross-sectional views of a semiconductor device according to example embodiments.
Figure 1B:
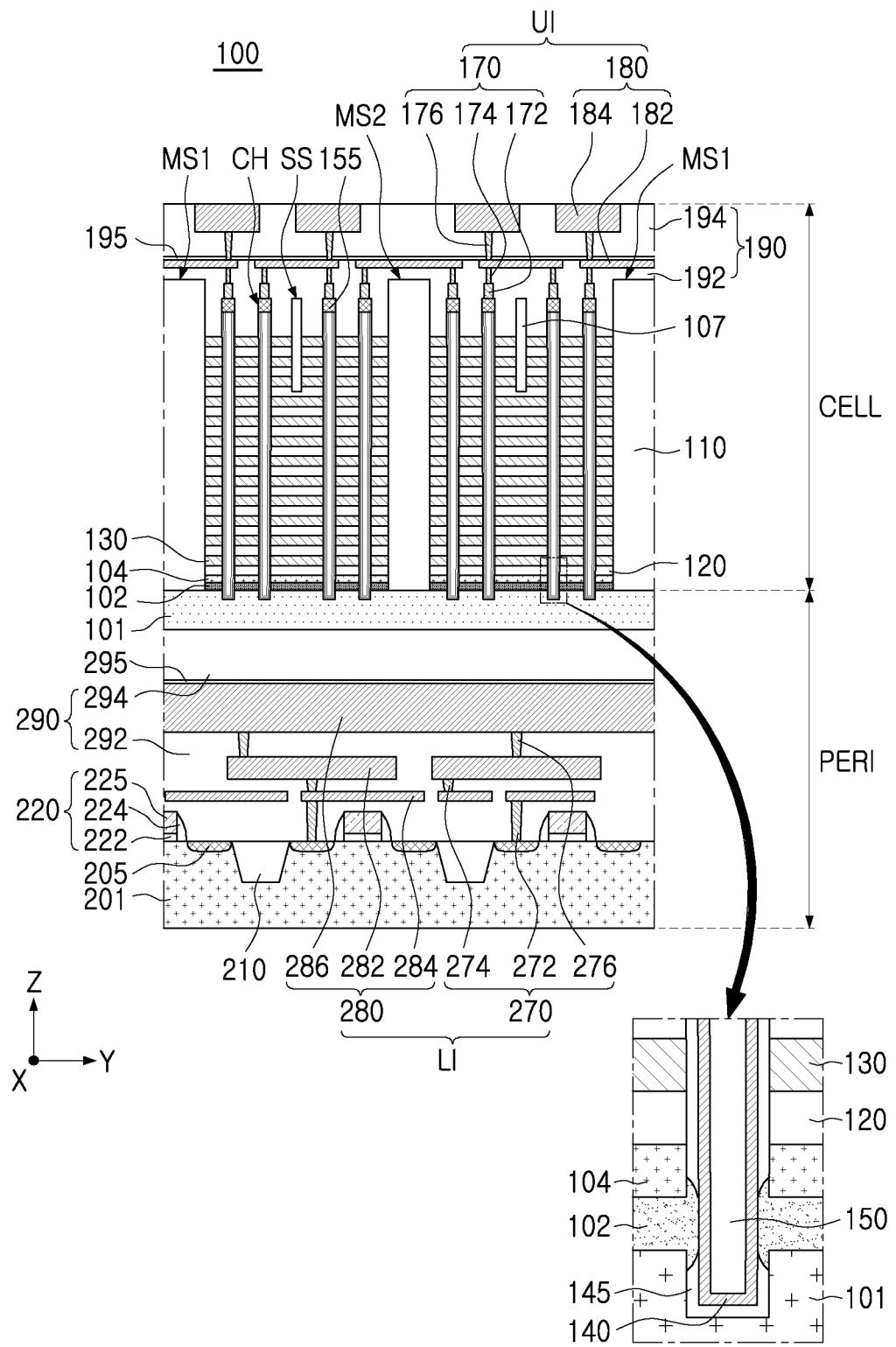

FIGS. 1A and 1B are schematic cross-sectional views of a semiconductor device according to example embodiments.

Figure 2A:
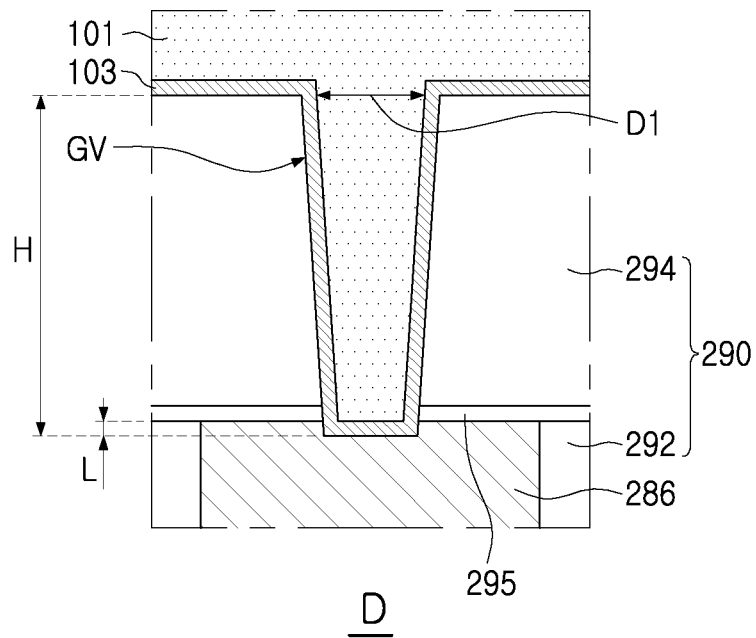
FIGS. 2A and 2B are enlarged views of a portion of a semiconductor device according to example embodiments.
Figure 2B:
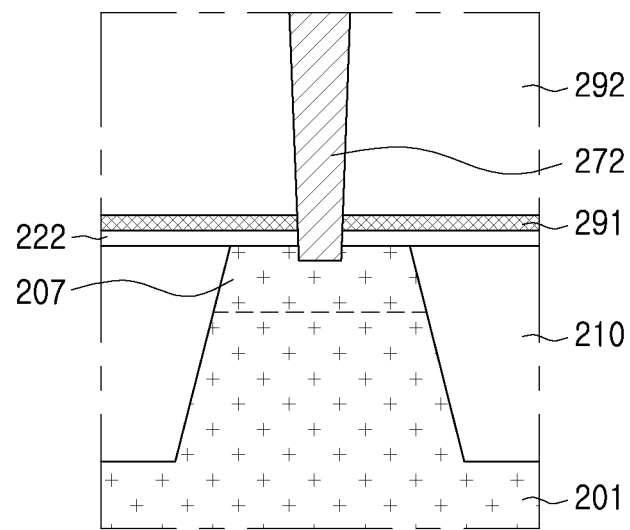

FIGS. 2A and 2B are enlarged views of a portion of a semiconductor device according to example embodiments. FIGS. 2A and 2B illustrate region "D" and region "E" illustrated in FIG. 1A, respectively.

Referring to FIGS. 1A to 2B, a semiconductor device 100 may include a peripheral circuit region PERI including a first substrate 201, a memory cell region CELL including a second substrate 101, a through interconnection region TR including a first through via 165 electrically connecting the peripheral circuit region PERI to the memory cell region CELL, and a ground interconnection structure GI connecting the first substrate 201 and the second substrate 101. The memory cell region CELL may be disposed on the peripheral circuit region PERI. In example embodiments, alternatively, the memory cell region CELL may be disposed below the peripheral circuit region PERI. The through interconnection region TR may be disposed to extend from the memory cell region CELL to the peripheral circuit region PERI. The ground interconnection structure GI may be disposed to extend from a lower region of the memory cell region CELL to the peripheral circuit region PERI.

The peripheral circuit region PERI may include the first substrate 201, source/drain regions 205 and device isolation layers 210 disposed in the first substrate 201, circuit devices 220 disposed on the first substrate 201, a peripheral region insulating layer 290, a lower protective layer 295, and a first interconnection structure LI.

The first substrate 201 may have an upper surface extending in an x direction and a y direction. An active region may be defined by the device isolation layers 210 on the first substrate 201. The source/drain regions 205 including impurities may be disposed in a portion of the active region. The first substrate 201 may include a semiconductor material, such as a group IV semiconductor, a group III-V compound semiconductor, or a group II-VI compound semiconductor. The first substrate 201 may also be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit device 220 on the first substrate 201. The peripheral region insulating layer 290 may include first and second peripheral region insulating layers 292 and 294, and each of the first and second peripheral region insulating layers 292 and 294 may also include a plurality of insulating layers. The peripheral region insulating layer 290 may be formed of an insulating material.

The lower protective layer 295 may be disposed on an upper surface of third lower interconnection lines 286 between the first and second peripheral region insulating layers 292 and 294. In example embodiments, the lower protective layer 295 may further be disposed on upper surfaces of first and second lower interconnection lines 282 and 284. The lower protective layer 295 may be a layer for preventing contamination caused by a metal material of lower interconnection lines 280 disposed on a lower portion of the lower protective layer 295. The lower protective layer 295 may be formed of a material different from a material of the peripheral region insulating layer 290. For example, the lower protective layer 295 may include silicon nitride, for example.

The first interconnection structure LI may be an interconnection structure electrically connected to the circuit devices 220 and the source/drain regions 205. The first interconnection structure LI may include lower contact plugs 270 each having a cylindrical shape and lower interconnection lines 280 each having a line shape. The lower contact plugs 270 may include first to third lower contact plugs 272, 274, and 276. The first lower contact plugs 272 may be disposed on the circuit devices 220 and the source/drain regions 205, the second lower contact plugs 274 may be disposed on the first lower interconnection lines 282, and the third lower contact plugs 276 may be disposed on the second lower interconnection lines 284. The lower interconnection lines 280 may include first to third lower interconnection lines 282, 284, and 286. The first lower interconnection lines 282 may be disposed on the first lower contact plugs 272, the second lower interconnection lines 284 may be disposed on the second lower contact plugs 274, and the third lower interconnection lines 286 may be disposed on the third lower contact plugs 276. The first interconnection structure LI may include a conductive material. For example, the first interconnection structure LI may include tungsten (W), copper (Cu), aluminum (Al), or the like, for example, and each of the elements may further include a diffusion barrier. However, in example embodiments, the numbers of layers and arrangement forms of the lower contact plugs 270 and the lower interconnection lines 280 constituting the first interconnection structure LI may be varied.

The memory cell region CELL may include a second substrate 101 having a first region A and a second region B, first and second horizontal conductive layers 102 and 104 on the second substrate 101, gate electrodes 130 stacked on the second substrate 101, first and second separation regions MS1 and MS2 extending while penetrating a stack structure of the gate electrodes 130, upper separation regions SS penetrating a portion of the stack structure, channel structures CH disposed to penetrate the stack structure, and a second interconnection structure UI electrically connected to the gate electrodes 130 and the channel structures CH. The memory cell region CELL may further include a substrate insulating layer 105, interlayer insulating layers 120 alternately stacked with the gate electrodes 130 on the second substrate 101, gate contacts 162 connected to the gate electrodes 130, a substrate contact 164 connected to the second substrate 101, a cell region insulating layer 190 covering the gate electrodes 130, and an upper protective layer 195.

The memory cell region CELL may further have a third region C on an external side of the second substrate 101, and a through interconnection structure such as a second through via 167 for connecting the memory cell region CELL to the peripheral circuit region PERI may be disposed in the third region C.

The first region A of the first substrate 201 may be a region in which the gate electrodes 130 may be vertically stacked and the channel structures CH may be disposed, and memory cells may also be disposed in the first region A. The second region B may be a region in which the gate electrodes 130 may extend by different lengths, and may be a region for electrically connecting the memory cells to the peripheral circuit region PERI. The second region B may be disposed on at least one end of the first region A in at least one direction, in the x direction, for example.

The second substrate 101 may have an upper surface extending in the x direction and the y direction. The second substrate 101 may include a semiconductor material, such as a group IV semiconductor, a group compound semiconductor, or a group II-VI compound semiconductor. For example, a group IV semiconductor may include silicon, germanium, or silicon-germanium. The second substrate 101 may further include impurities. The second substrate 101 may be provided as a polycrystalline semiconductor layer such as a polycrystalline silicon layer, or an epitaxial layer. The second substrate 101 may also be provided as a bulk semiconductor substrate. The second substrate 101 may have a substantially planar upper surface, and a lower surface which may not be planar as a result of a protrusion by an upper via GV.

The first and second horizontal conductive layers 102 and 104 may be stacked and disposed on the upper surface of the second substrate 101. At least a portion of the first and second horizontal conductive layers 102 and 104 may function as a portion of a common source line of the semiconductor device 100. For example, at least a portion of the first and second horizontal conductive layers 102 and 104 may function as common source lines along with the second substrate 101, for example. As illustrated in the enlarged view in FIG. 1B, the first horizontal conductive layer 102 may be directly connected to a channel layer 140 in a circumference of the channel layer 140. The first and second horizontal conductive layers 102 and 104 may include a semiconductor material, such as a polycrystalline silicon, for example. In this case, at least the first horizontal conductive layer 102 may be a doped layer, and the second horizontal conductive layer 104 may be a doped layer or a layer including impurities diffused from the first horizontal conductive layer 102. According to example embodiments, the first and second horizontal conductive layers 102 and 104 may not extend across the entire span of the second region B of the second substrate 101. For example, an insulating layer may be disposed in a portion of the second region B instead of the first and second horizontal conductive layers 102 and 104.

The substrate insulating layer 105 may be disposed in a region formed by partially removing the second substrate 101 and the first and second horizontal conductive layers 102 and 104, and may be disposed to be surrounded by the second substrate 101 and the first and second horizontal conductive layers 102 and 104. A lower surface of the substrate insulating layer 105 may be coplanar with the lower surface of the second substrate 101, or may be disposed on a level lower than a level of the lower surface of the second substrate 101. In some example embodiments, the substrate insulating layer 105 may be disposed in a region formed by only removing the second substrate 101. In this case, the substrate insulating layer 105 may have an upper surface substantially coplanar with the upper surface of the second substrate 101, and another insulating layer surrounded by the first and second horizontal conductive layers 102 and 104 may further be disposed on an upper portion. The substrate insulating layer 105 may be formed of an insulating material. For example, the substrate insulating layer 105 may include silicon oxide, silicon oxynitride, or silicon nitride.

The gate electrodes 130 may be vertically spaced apart from each other and stacked on the second substrate 101 and may constitute a stack structure. The gate electrodes 130 may include electrodes sequentially constituting gates of ground select transistors, memory cells (e.g., memory cell transistors), and string select transistors. The number of the gate electrodes 130 constituting the memory cells may be determined depending on capacity of the semiconductor device 100. The number of the gate electrodes 130 forming the string select transistors (i.e., the number of string select lines) and the number of the gate electrodes forming the ground select transistors (i.e., the number of ground select lines) may be one or more (e.g., two), and such gate electrodes 130 may have a structure the same as or different from a structure of the gate electrodes 130 of the memory cells. Also, the gate electrodes 130 may further include a gate electrode 130 disposed on an upper portion of the gate electrode 130 constituting the string select transistor and/or below a lower portion of the gate electrode 130 constituting the ground select transistor, and form erase transistors used in an erase operation using a gate induced drain leakage (GIDL) phenomenon. Also, some of the gate electrodes 130 adjacent to the gate electrode 130 constituting the string select transistor (e.g., adjacent the string select line(s)) or the ground select transistor (e.g., adjacent the ground select line(s)), for example, may be dummy gate electrodes.

The gate electrodes 130 may be spaced apart from each other vertically and stacked on the first region A, may extend from the first region A to the second region B by different lengths, and may form a staircase-shaped stepped structure. The gate electrodes 130 may form a stepped structure between the gate electrodes 130 in the x direction as illustrated in FIG. 1A. In some example embodiments, a certain number of the gate electrodes 130 such as two to six gate electrodes 130, for example, may form a single gate group and may form a stepped structure between the gate groups in the x direction. In this case, the gate electrodes 130 forming the single gate group may be disposed to have a stepped structure also in the y direction. By the stepped structure, the gate electrodes 130 may form a staircase form in which the gate electrodes 130 disposed in a lower portion extend longer than the gate electrodes 130 disposed in an upper portion (i.e., in the z direction) and may provide ends exposed from the interlayer insulating layers 120 to an upper portion. In some example embodiments, the gate electrodes 130 may have an increased thickness on the ends (i.e., in the x and/or y directions).

The gate electrodes 130 may include a metal material, tungsten (W), for example. In example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), titanium nitride (TiN), or combinations thereof.

The interlayer insulating layers 120 may be disposed between the gate electrodes 130. The interlayer insulating layers 120 may also be spaced apart from each other in a direction perpendicular to the upper surface of the second substrate 101 and may extend in the x direction, similarly to the gate electrodes 130. The interlayer insulating layers 120 may include an insulating material such as silicon oxide or silicon nitride.

The first and second separation regions MS1 and MS2 may be disposed to penetrate the gate electrodes 130 and may extend in the x direction in the first region A and the second region B. The first and second separation regions MS1 and MS2 may be disposed to be parallel to each other. As illustrated in FIG. 1B, the first and second separation regions MS1 and MS2 may penetrate the entire gate electrodes 130 stacked on the second substrate 101 and may be connected to the second substrate 101. The first separation regions MS1 may extend as a single layer along the first region A and the second region B, and the second separation regions MS2 may extend only to a portion of the second region B or may be disposed intermittently in the first region A and the second region B. However, in example embodiments, an arrangement order, an arrangement interval, or the like, of the first and second separation regions MS1 and MS2 may be varied.

A separation insulating layer 110 may be disposed in the first and second separation regions MS1 and MS2. In example embodiments, the separation insulating layer 110 may have a shape in which a width may decrease towards the second substrate 101 due to a high aspect ratio. However, in example embodiments, a conductive layer may further be disposed within the separation insulating layers 110 in the first and second separation regions MS1 and MS2. In this case, the conductive layer may function as a common source line or a contact plug connected to a common source line.

The upper separation regions SS may extend in the x and z directions between the first separation regions MS1 and the second separation regions MS2. The upper separation regions SS may be disposed in a portion of the second region B and in the first region A to penetrate a portion of the gate electrodes 130 including an uppermost gate electrode 130 of the gate electrodes 130. The upper separation regions SS may separate three gate electrodes 130 in the y direction in total, for example, as illustrated in FIG. 1B. However, the number of the gate electrodes 130 separated by the upper separation regions SS may be varied in example embodiments. The upper separation regions SS may include an upper separation insulating layer 107.

Each of the channel structures CH may form a single memory cell string, and may be spaced apart from each other while forming rows and columns on the first region A. The channel structures CH may be disposed to form a lattice pattern or may be disposed in a zigzag pattern in one direction on an x-y plane. The channel structures CH may have a cylindrical shape, and may have an inclined side surface of which a width decreases towards the second substrate 101 depending on an aspect ratio. In example embodiments, dummy channels which do not constitute a memory cell string may be disposed on the end of the first region A adjacent to the second region B and may also be disposed on the end of the second region B.

As illustrated in the enlarged view illustrated in FIG. 1B, a channel layer 140 may be disposed in the channel structures CH. The channel layer 140 in the channel structures CH may have an annular shape surrounding a channel insulating layer 150 disposed therein, but in example embodiments, the channel layer 140 may have a columnar shape such as a cylindrical shape or a prism shape without the channel insulating layer 150 inside. The channel layer 140 may be connected to the first horizontal conductive layer 102 in a lower portion. The channel layer 140 may include a semiconductor material such as polycrystalline silicon or single crystalline silicon. The channel structures CH extend in the z direction and are disposed linearly in the y direction between the first and second separation regions MS1 and MS2. The upper separation regions SS may be electrically separated from each other by a second interconnection structure UI connected to channel pads 155.

In the channel structures CH, the channel pads 155 may be disposed on an upper portion of the channel layer 140. The channel pads 155 may be disposed to cover an upper surface of the channel insulating layer 150 and to be electrically connected to the channel layer 140. The channel pads 155 may include doped polycrystalline silicon, for example.

A gate dielectric layer 145 may be disposed between the gate electrodes 130 and the channel layer 140. The gate dielectric layer 145 may include a tunneling layer, an electric charge storage layer, and a blocking layer, sequentially stacked from the channel layer 140. The tunneling layer may tunnel an electric charge to the electric charge storage layer, and may include silicon oxide ($SiO_2$), silicon nitride ($Si_3N_4$), silicon oxynitride (SiON), or combinations thereof. The electric charge storage layer may be an electric charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 145 may extend in a horizontal direction along the gate electrodes 130.

A cell region insulating layer 190 may cover the second substrate 101, the gate electrodes 130 on the second substrate 101, and the peripheral region insulating layer 290. The cell region insulating layer 190 may include first and second cell region insulating layers 192 and 194, and each of the first and second cell region insulating layers 192 and 194 may also include a plurality of insulating layers. The cell region insulating layer 190 may be formed of an insulating material.

An upper protective layer 195 may be disposed on an upper surface of first upper interconnection lines 182 between the first and second cell region insulating layers 192 and 194. In example embodiments, the upper protective layer 195 may further be disposed on an upper surface of second upper interconnection lines 184. The upper protective layer 195 may be a layer for preventing contamination caused by a metal material of upper interconnection lines 180 disposed on a lower portion. The upper protective layer 195 may be formed of an insulating material different from that of the cell region insulating layer 190, and may include silicon nitride, for example.

Gate contacts 162 may be connected to the gate electrodes 130 in the second region B. For example, each of the plurality of gate contacts 162 may be disposed to penetrate at least a portion of the first cell region insulating layer 192 and connect to one of the gate electrodes 130 exposed to an upper portion, respectively. The substrate contact 164 may be connected to the second substrate 101 on an end of the second region B. The substrate contact 164 may penetrate at least a portion of the first cell region insulating layer 192 and may be connected to the second substrate 101. The substrate contact 164 may apply an electrical signal to a common source line including the second substrate 101, for example.

The second interconnection structure UI may be an interconnection structure electrically connected to the gate electrodes 130 and the channel structures CH. The second interconnection structure UI may include upper contact plugs 170 each having a cylindrical shape and upper interconnection lines 180 each having a line shape. The upper contact plugs 170 may include first to third upper contact plugs 172, 174, and 176. The first upper contact plugs 172 may be disposed on the channel pads 155, the gate contacts 162, and the substrate contact 164. The second upper contact plugs 174 may be disposed on the first upper contact plugs 172, and the third upper contact plugs 176 may be disposed on the first upper interconnection lines 182. The upper interconnection lines 180 may include the first and second upper interconnection lines 182 and 184. The first upper interconnection lines 182 may be disposed on the second upper contact plugs 174, and the second upper interconnection lines 182 may be disposed on the third upper contact plugs 176. The second interconnection structure UI may include a conductive material. For example, the second interconnection structure UI may include tungsten (W), copper (Cu), aluminum (Al), or the like, for example, and each may further include a diffusion barrier layer. In example embodiments, the numbers of layers and arrangement forms of the lower contact plugs 170 and the lower interconnection lines 180 constituting the second interconnection structure UI may be varied.

The through interconnection region TR may be a region including a through interconnection structure for electrically connecting the memory cell region CELL and the peripheral circuit region PERI. The through interconnection region TR may include a first through via 165 penetrating the second substrate 101 from an upper portion of the memory cell region CELL and extending in a z direction and an insulating region surrounding the first through via 165. The insulating region may include sacrificial insulating layers 118, interlayer insulating layers 120 disposed parallel to the sacrificial insulating layers 118, and a substrate insulating layer 105. The size, arrangement, and shape of the through interconnection region TR may vary (e.g., in accordance with the design). In FIG. 1A, the through interconnection region TR may be disposed in the second region B, but the invention is not limited thereto, and the through interconnection region TR may also be disposed in the first region A. The through interconnection region TR may be spaced apart from the first and second separation regions MS1 and MS2. For example, the through interconnection region TR may be disposed in a central portion of first region A between a pair of the first separation regions MS1 adjacent to each other in the y direction. Accordingly, the sacrificial insulating layers 118 may remain in the through interconnection region TR.

The first through via 165 may partially penetrate a first cell region insulating layer 192, the insulating region, a lower protective layer 295, and a second peripheral region insulating layer 294 from an upper portion, and may extend perpendicularly to the upper surface of the second substrate 101. An upper end of the first through via 165 may be connected to the second interconnection structure UI, and a lower end may be connected to the first interconnection structure LI. In example embodiments, in the through interconnection region TR, the number, an arrangement form, and a shape of the first through via 165 may be varied. The first through via 165 may include a conductive material. For example, the first through via 165 may include a metal material such as tungsten (W), copper (Cu), aluminum (Al), or the like.

The sacrificial insulating layers 118 may be disposed on a level the same as a level of the gate electrodes 130 and may have a thickness the same as a thickness of the gate electrodes 130, and a side surface thereof may be in contact with the gate electrodes 130 on a boundary of the through interconnection region TR. The sacrificial insulating layers 118 may be alternately stacked with the interlayer insulating layers 120 and may form an insulating region. The sacrificial insulating layers 118 may be disposed with a width the same as or different from a width of the substrate insulating layer 105. The sacrificial insulating layers 118 may be formed of an insulating material different from an insulating material of the interlayer insulating layers 120, and may include silicon oxide, silicon nitride, or silicon oxynitride, for example.

The second through via 167 may be disposed in the third region C of the memory cell region CELL, an external side region of the second substrate 101, and may extend to the peripheral circuit region PERI. The second through via 167 may connect the second interconnection structure UI and the first interconnection structure LI, similarly to the first through via 165 of the through interconnection region TR. However, the second through via 167 may penetrate only a portion of the first cell region insulating layer 192 and the second peripheral region insulating layer 294 from an upper portion. The second through via 167 may include a conductive material. For example, the second through via 167 may include a metal material such as tungsten (W), copper (Cu), aluminum (Al), or the like, for example.

The ground interconnection structure GI may be disposed throughout the peripheral circuit region PERI and the memory cell region CELL to connect the first substrate 201 and the second substrate 101. The ground interconnection structure GI may perform a function of grounding the second substrate 101 in a process of manufacturing the semiconductor device 100. The ground interconnection structure GI may include a lower interconnection structure corresponding to the first interconnection structure LI by similarly including lower contact plugs 270 and lower interconnection lines 280. The ground interconnection structure GI may further include an upper via GV connected to the third lower interconnection lines 286 of the lower interconnection lines 280. The ground interconnection structure GI may be may be referred to as a third interconnection structure, distinguished from the first and second interconnection structures LI and UI.

Although only one ground interconnection structure GI is illustrated in FIG. 1A, a plurality of ground interconnection structures GI may be disposed and spaced apart from each other in the semiconductor device 100. The ground interconnection structure GI may be disposed on a lower portion of the second region B of the second substrate 101. Also, the ground interconnection structure GI may be disposed on a lower portion of the first and second horizontal conductive layers 102 and 104 in a region in which the first and second horizontal conductive layers 102 and 104 extend longer than the gate electrodes 130, but the invention is not limited thereto. In example embodiments, the ground interconnection structure GI may also be disposed on a lower portion of the first region A of the second substrate 101. The ground interconnection structure GI may be spaced apart from the circuit devices 220 of the peripheral circuit region PERI.

The upper via GV may penetrate the second peripheral region insulating layer 294 and the lower protective layer 295 and may be directly connected to the third lower interconnection line 286. The upper via GV may be integrated with the second substrate 101 of the memory cell region CELL. As illustrated in FIG. 2A, the upper via GV may have a form in which the second substrate 101 extends into a via hole towards the first substrate 201. The upper via GV may be formed together with the second substrate 101 and may include a material the same as that of the second substrate 101, and an interfacial surface may not be present between the upper via GV and the second substrate 101. Specifically, the upper via GV and the second substrate 101 are formed of the same material. The upper via GV may protrude from the lower surface of the second substrate 101 in a cylindrical shape or a conical shape.

The upper via GV may further include a barrier layer 103 extending from the lower surface of the second substrate 101. The barrier layer 103 may extend from the lower surface of the second substrate 101 along an internal side wall of the via hole to cover a bottom surface of the via hole. The barrier layer 103 may include a metal nitride. For example, the barrier layer 103 may include titanium nitride (TiN), titanium silicon nitride (TiSiN), tungsten nitride (WN), tantalum nitride (TaN), or combinations thereof. When a region of the upper via GV extending from the second substrate 101 includes a semiconductor material and the third lower interconnection line 286 includes a metal material, a defect may occur in a semiconductor-metal interfacial surface. However, in this case, as the barrier layer 103 is disposed between a semiconductor layer of the upper via GV integrated with the second substrate 101 and the third lower interconnection line 286 is disposed on a lower portion, the occurrence of the defect in the upper via GV may be prevented.

The upper via GV may have a height H in a range of about 3000 Å to about 5000 Å in the z direction, a first direction. As the upper via GV is formed to be connected to the third lower interconnection line 286, the upper via GV may have a relatively small height H as compared to a thickness of the peripheral region insulating layer 290, thereby easily performing a process of forming the upper via GV. The upper via GV may have a greater diameter in an upper portion than in a lower portion. For example, the upper via GV may have a diameter D1 in a range of about 200 nm to about 300 nm in an overall portion including the upper portion and the lower portion. The diameter D1 of the upper via GV may be greater than an average diameter D2 of the gate contacts 162 and an average diameter D3 of the first and second through vias 165 and 167, but the invention is not limited thereto. The upper via GV may be disposed to recess the third lower interconnection line 286 by a certain depth L. The depth L may be within a range of about 30 Å to about 90 Å.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The lower interconnection structure, forming a portion of the ground interconnection structure GI, may include the elements similar to the first interconnection structure LI, and may be electrically separated from the first interconnection structure LI. The lower interconnection structure may include first to third lower contact plugs 272, 274, and 276 and first to third lower interconnection lines 282, 284, and 286, spaced apart from the first interconnection structure LI.

As illustrated in FIG. 2B, in the lower interconnection structure, a lowermost first lower contact plug 272 may penetrate a portion of the first peripheral region insulating layer 292, an etching stop layer 291, and the circuit gate dielectric layer 222 and may be connected to an impurity region 207 disposed in the first substrate 201. The circuit gate dielectric layer 222 may be a layer extending from the circuit devices 220, and the etching stop layer 291 may be formed on the circuit gate dielectric layer 222 and may perform an etching stop function when the first lower contact plugs 272 are formed. The impurity region 207 may be a doped layer formed in a region connected to the first lower contact plugs 272 to electrically connect the first lower contact plugs 272 to the first substrate 201. In the lower interconnection structure, the first lower contact plugs 272 may be connected to the impurity region 207 disposed in a region surrounded by the device isolation layers 210.

Figure 3A:
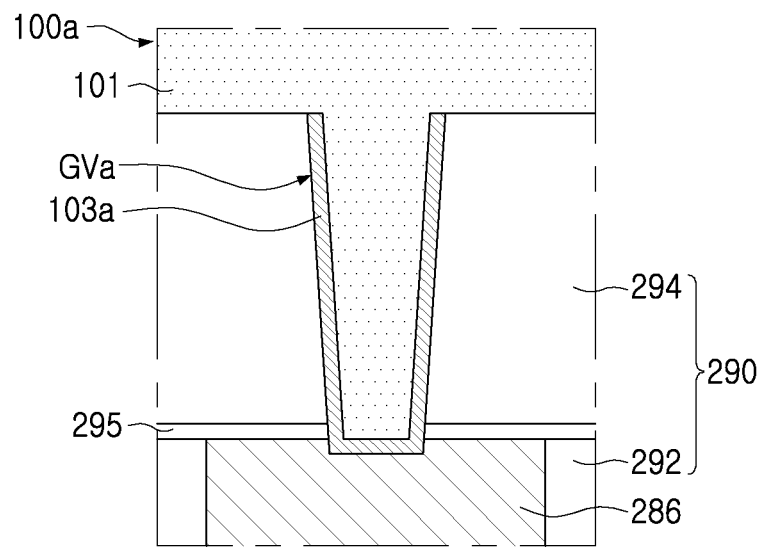
FIGS. 3A to 3C are enlarged views illustrating a portion of a semiconductor device according to example embodiments.
Figure 3B:
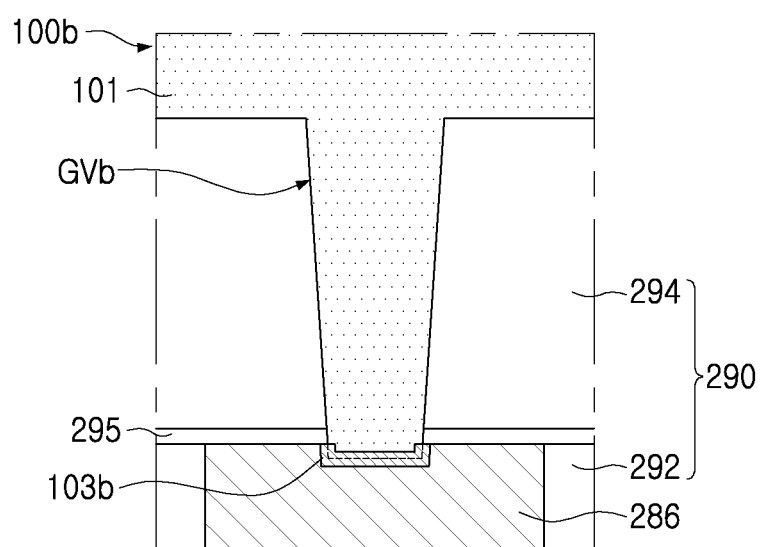
Figure 3C:
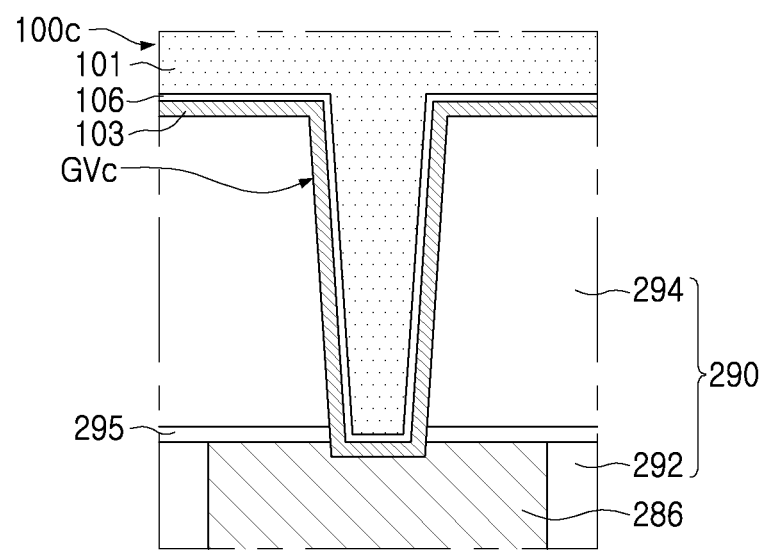

FIGS. 3A to 3C are enlarged views illustrating a portion of a semiconductor device according to example embodiments. FIGS. 3A to 3C illustrate a region corresponding to region "D" illustrated in FIG. 1A.

Referring to FIG. 3A, in a semiconductor device 100a, an upper via GVa of a ground interconnection structure GI may include a barrier layer 103a covering an internal side wall and a bottom surface of a via hole. However, the barrier layer 103a may be limitedly disposed in the via hole and may not extend along a lower surface of the second substrate 101, differently from the example embodiment illustrated in FIG. 2A. In this case, an area of the barrier layer 103a exposed through an upper surface of the via hole may be reduced in a process of manufacturing the semiconductor device 100a so that process variables caused by the barrier layer 103a may be reduced.

The barrier layer 103a having such a structure may be formed by a manufacturing method including depositing a material for forming the barrier layer 103a, forming a sacrificial layer filling the via hole, performing a planarization process, removing the sacrificial layer, and forming the second substrate 101.

Referring to FIG. 3B, in a semiconductor device 100b, an upper via GVb of a ground interconnection structure GI may include a barrier layer 103b disposed on a lower end of a via hole. The barrier layer 103b may be formed by a nitridation process. In this case, as the barrier layer 103b is formed while partially consuming a third lower interconnection line 286 disposed on a lower portion of the via hole, the barrier layer 103b may have a form expanding from a boundary of the via hole marked by a dotted line on a lower end of the via hole to an upper portion of the via hole and also to a lower portion of the via hole.

Referring to FIG. 3C, in a semiconductor device 100c, an upper via GVc of the ground interconnection structure GI may include a second substrate 101 and a barrier layer 103 and may further include a metal-semiconductor layer 106 disposed between the second substrate 101 and the barrier layer 103. The metal-semiconductor layer 106 may be a layer including a metal element included in the barrier layer 103 and a semiconductor element included in the second substrate 101. For example, the metal-semiconductor layer 106 may include titanium silicide (TiSi), tungsten silicide (WSi), nickel silicide (NiSi), cobalt silicide (CoSi), or other metal silicide. The metal-semiconductor layer 106 may be formed on an interfacial surface with the barrier layer 103 when the second substrate 101 is formed according to a process of forming the second substrate 101.

Figure 4:
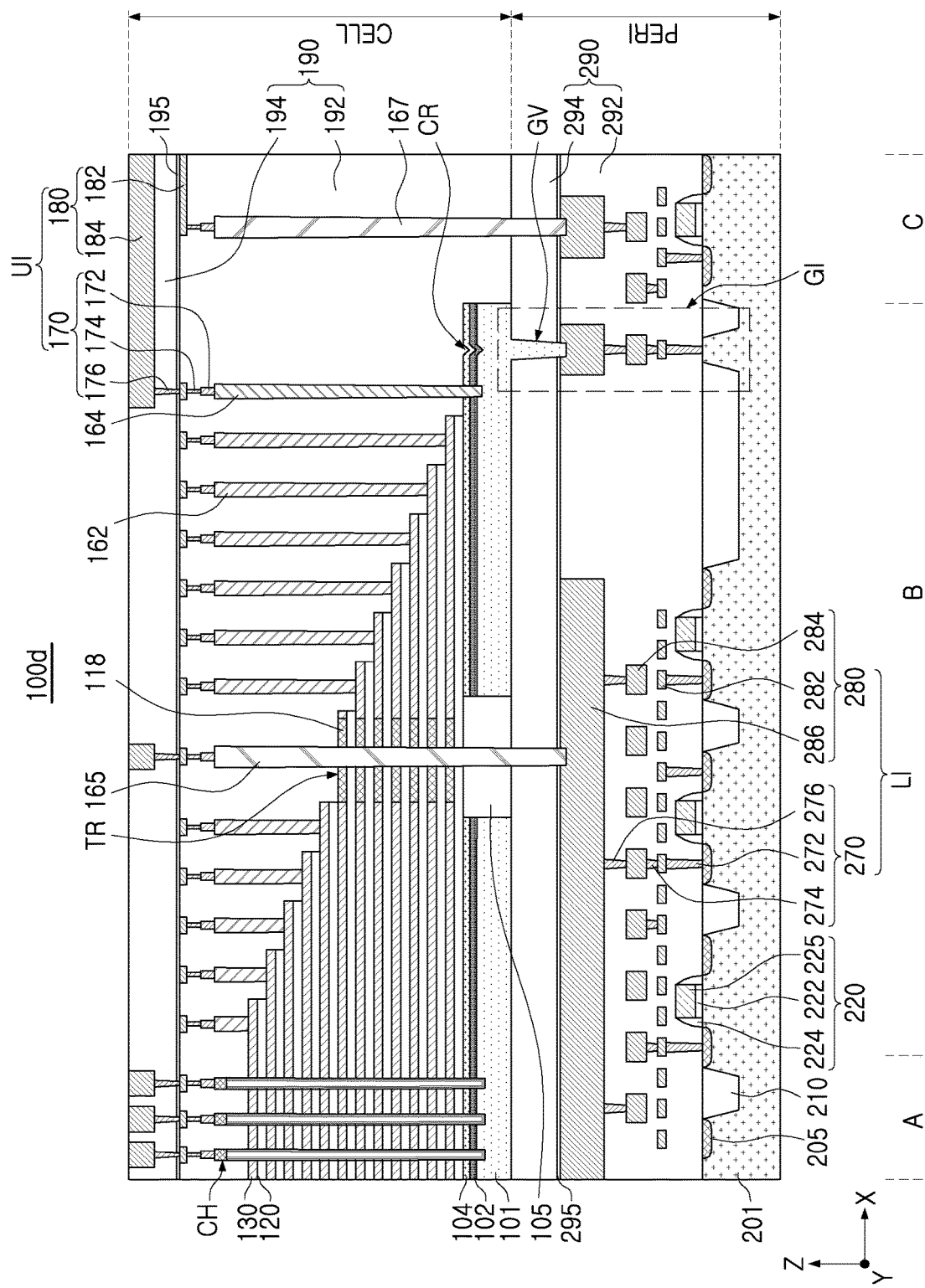
FIGS. 4 to 6 are schematic cross-sectional views of a semiconductor device according to example embodiments.
Figure 5:
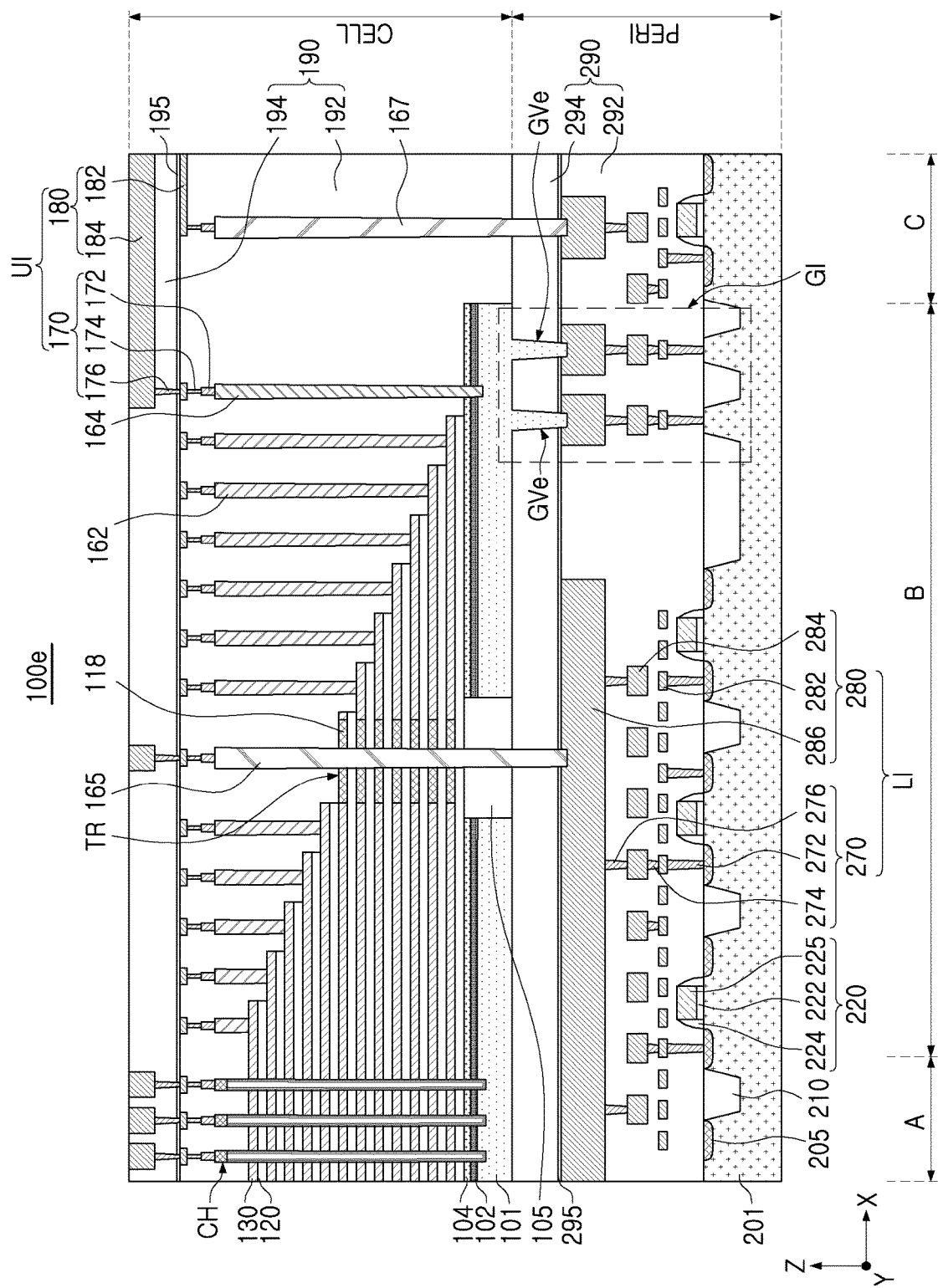
Figure 6:
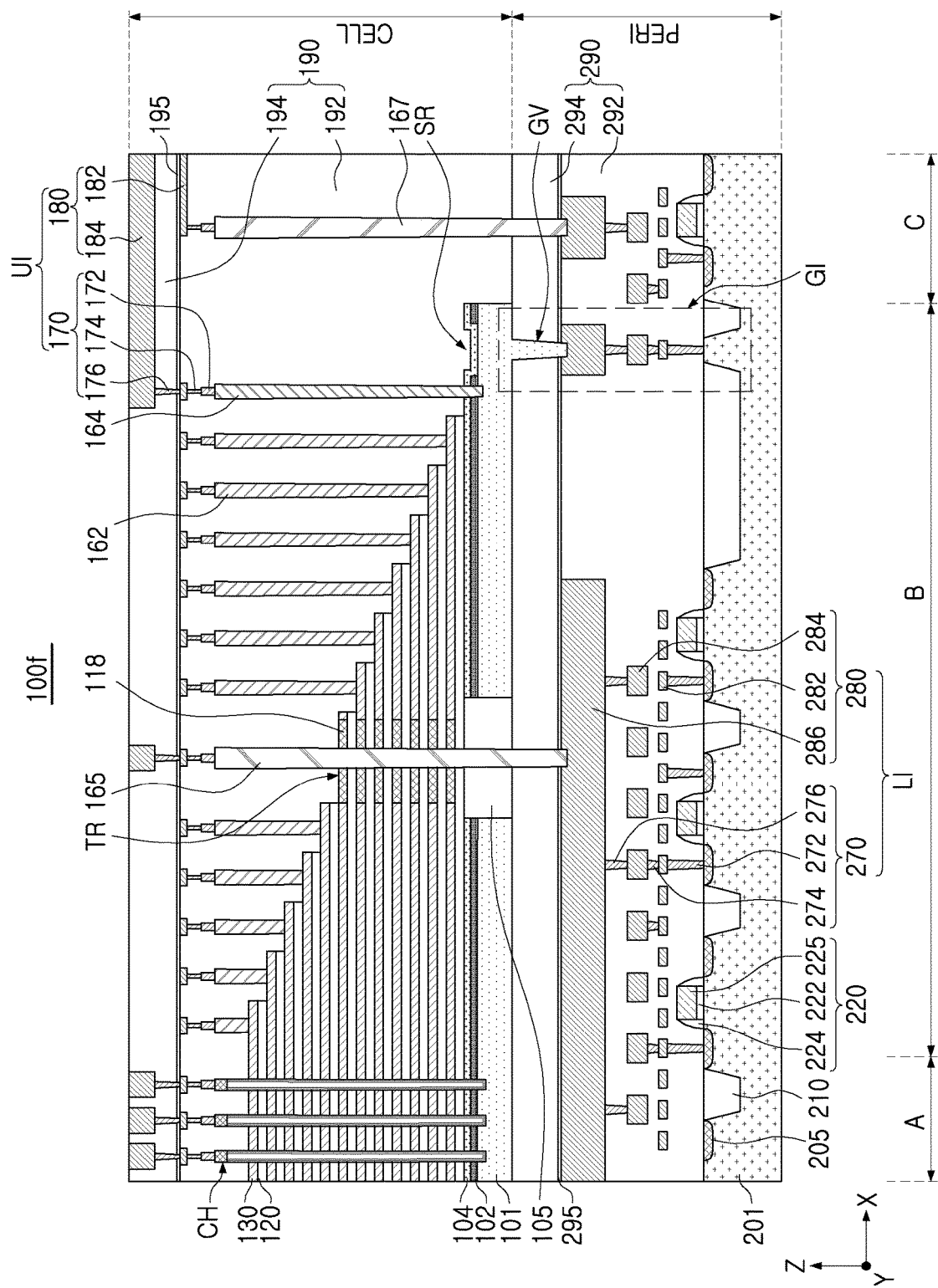

FIGS. 4 to 6 are schematic cross-sectional views of a semiconductor device according to example embodiments. FIGS. 4 to 6 illustrate regions corresponding to the region illustrated in FIG. 1A.

Referring to FIG. 4, in a semiconductor device 100d, a second substrate 101 and first and second horizontal conductive layers 102 and 104 may have a recessed portion CR formed on an upper portion of a ground interconnection structure GI. The recessed portion CR may be disposed on an upper portion of an upper via GV, and a center of the recessed portion CR may be disposed on the substantially same linear line (i.e., aligned) in the z direction with a center of the upper via GV. In example embodiments, the recessed portion CR may be formed only on the second substrate 101.

Referring to FIG. 5, in a semiconductor device 100e, a ground interconnection structure GI may include a plurality of upper vias GVe disposed side by side. For example, the ground interconnection structure GI may include two upper vias GVe and a plurality of lower interconnection structures connected to the upper vias GVe in lower portions of the upper vias GVe, respectively. The plurality of lower interconnection structures may be separated from each other as illustrated, or may be connected to each other. The arrangement form of the upper vias GVe and the lower interconnection structures disposed in the ground interconnection structure GI may also be applied to other example embodiments.

Referring to FIG. 6, in a semiconductor device 100f, a memory cell region CELL may include a region from which a first horizontal conductive layer 102 is partially removed and in which the second horizontal conductive layer 104 is in contact with a second substrate 101. The second horizontal conductive layer 104 may have a concave region SR formed by removing the first horizontal conductive layer 102 from the region. The concave region SR may be disposed to overlap at least a portion of the ground interconnection structure GI and/or the upper via GV in the z direction.

Figure 7A:
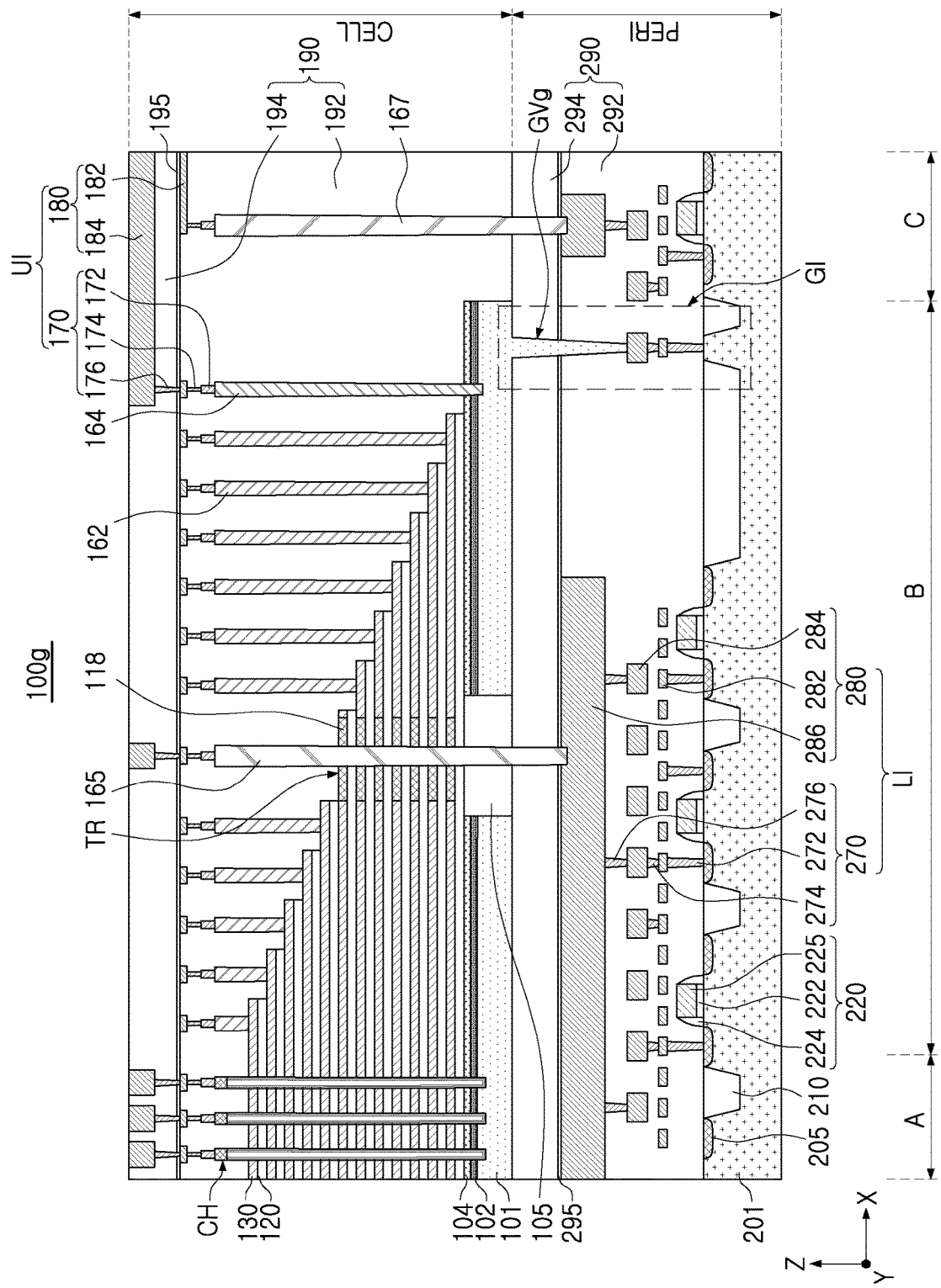
FIGS. 7A and 7B are schematic cross-sectional views of a semiconductor device according to example embodiments.
Figure 7B:
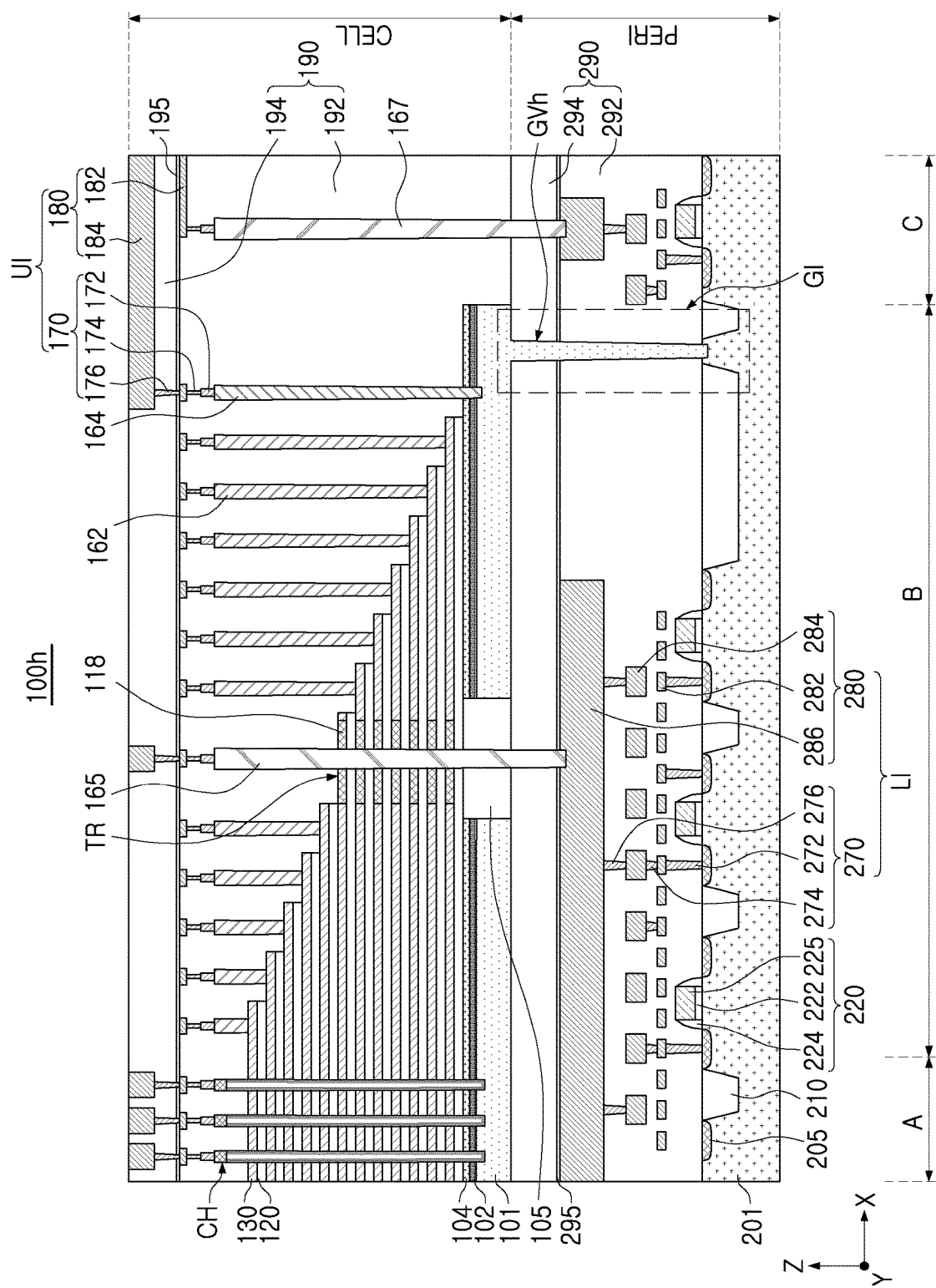

FIGS. 7A and 7B are schematic cross-sectional views of a semiconductor device according to example embodiments. FIGS. 7A and 7B illustrate regions corresponding to the region illustrated in FIG. 1A.

Referring to FIG. 7A, in a semiconductor device 100g, a ground interconnection structure GI may include an upper via GVg, and first and second lower contact plugs 272 and 274 and first and second lower interconnection lines 282 and 284 as a lower interconnection structure. In other words, the ground interconnection structure GI may only include a portion of first to third lower contact plugs 272, 274, and 276 and a portion of first to third lower interconnection lines 282, 284, and 286 as the lower interconnection structure. Accordingly, the upper via GVg may extend relatively more deeply than the upper via GV illustrated in the example embodiment in FIGS. 1A to 2B and may be connected to the second lower interconnection line 284. In this case also, the upper via GVg may include a barrier layer 103 as illustrated in FIG. 2A. Also, the upper via GVg may have a diameter relatively greater than that of the upper via GV illustrated in the example embodiment in FIGS. 1A to 2B, but the invention is not limited thereto.

Referring to FIG. 7B, in a semiconductor device 100h, a ground interconnection structure GI may only include an upper via GVh. Accordingly, the upper via GVh may not be connected to a lower interconnection structure and may extend from a second substrate 101 to a first substrate 201 disposed on a lower portion. In contrast to the structure illustrated in FIG. 2A, the upper via GVh in the example embodiment may not include a barrier layer 103. Also, the upper via GVh may have a diameter greater than that of the upper via GV illustrated in the example embodiment in FIGS. 1A to 2B, but the invention is not limited thereto.

Figure 8:
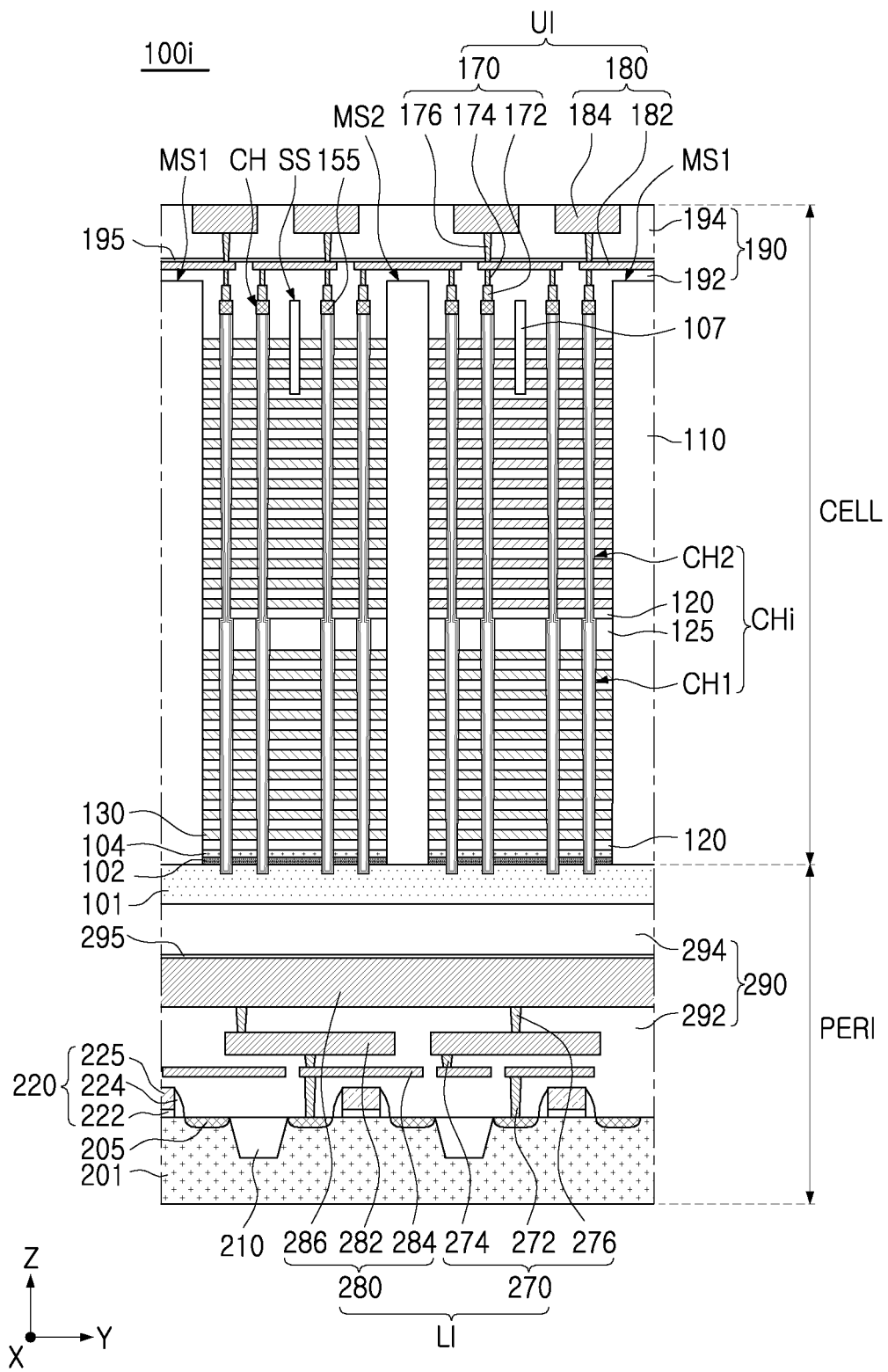
FIG. 8 is a schematic cross-sectional view of a semiconductor device according to example embodiments.

FIG. 8 is a schematic cross-sectional view of a semiconductor device according to example embodiments. FIG. 8 illustrates a region corresponding to the region illustrated in FIG. 1B.

Referring to FIG. 8, in a semiconductor device 100i, a stack structure of gate electrodes 130 may be constituted by vertically stacked lower and upper stack structures, and channel structures CHi may include vertically stacked first and second channel structures CH1 and CH2. The structure of the channel structures CHi may be introduced to stably form the channel structures CHi when the number of the stacked gate electrodes 130 are relatively large.

In the channel structures CHi, the first channel structures CH1 disposed on a lower portion may be connected to the second channel structures CH2 disposed on an upper portion, and the channel structures CHi may have a bent portion formed by a difference in widths in a connection region. A channel layer 140, a gate dielectric layer 145, and a channel insulating layer 150 may be connected to each other between the first channel structure CH1 and the second channel structure CH2. A channel pad 155 may only be disposed on an upper end of the second channel structure CH2 disposed on an upper portion. In example embodiments, each of the first channel structure CH1 and the second channel structure CH2 may also include the channel pad 155, and in this case, the channel pad 155 of the first channel structure CH1 may be connected to the channel layer 140 of the second channel structure CH2. An upper interlayer insulating layer 125 having a relatively thick thickness may be disposed on an uppermost portion of the lower stack structure. However, the forms of the interlayer insulating layers 120 and the upper interlayer insulating layer 125 may be varied in example embodiments.

FIGS. 9A to 9H are schematic cross-sectional views illustrating a method of manufacturing a semiconductor device according to example embodiments. FIGS. 9A to 9H illustrate regions corresponding to the region illustrated in FIG. 1A.

Figure 9A:
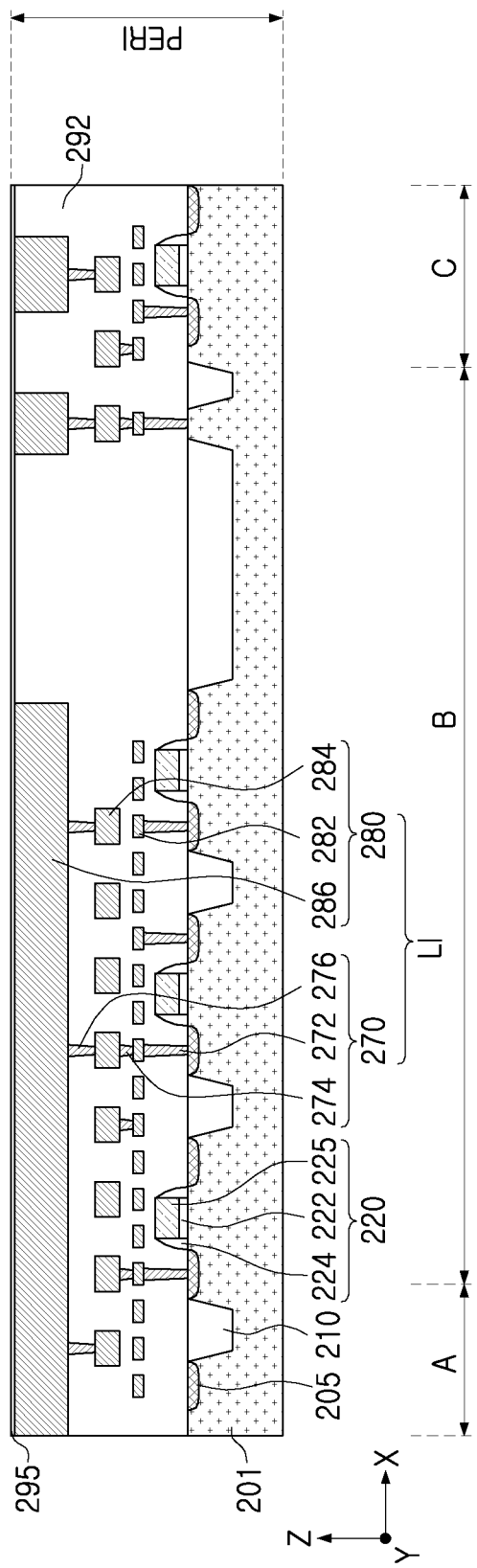
FIGS. 9A to 9H are schematic cross-sectional views illustrating a method of manufacturing a semiconductor device according to example embodiments.

Referring to FIG. 9A, circuit devices 220 and a first interconnection structure LI may be formed on a first substrate 201.

Firstly, device isolation layers 210 may be formed in the first substrate 201, and a circuit gate dielectric layer 222 and a circuit gate electrode 225 may be sequentially formed on the first substrate 201. The device isolation layers 210 may be formed by a shallow trench isolation (STI) process, for example. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of one of polycrystalline silicon or a metal silicide layer, but the invention is not limited thereto. Thereafter, a spacer layer 224 and source/drain regions 205 may be formed on both side walls of the circuit gate dielectric layer 222 and the circuit gate electrode 225. In example embodiments, the spacer layer 224 may include a plurality of layers. Thereafter, the source/drain regions 205 may be formed by performing an ion implantation process.

Lower contact plugs 270 of the first interconnection structure LI may be formed by partially forming a first peripheral region insulating layer 292, partially removing the element by an etching process, and filling a conductive material therein. Lower interconnection lines 280 may be formed by, for example, depositing and patterning a conductive material. When the first interconnection structure LI is formed, a lower interconnection structure constituting a portion of a ground interconnection structure GI (see FIG. 1A) may be formed together. Accordingly, the lower interconnection structure may have a stack structure the same as the first interconnection structure LI.

The first peripheral region insulating layer 292 may include a plurality of insulating layers. The first peripheral region insulating layer 292 may be partially formed at each of the processes for forming the first interconnection structure LI. A lower protective layer 295 covering an upper surface of a third lower interconnection lines 286 may be formed on the first peripheral region insulating layer 292.

Figure 9B:
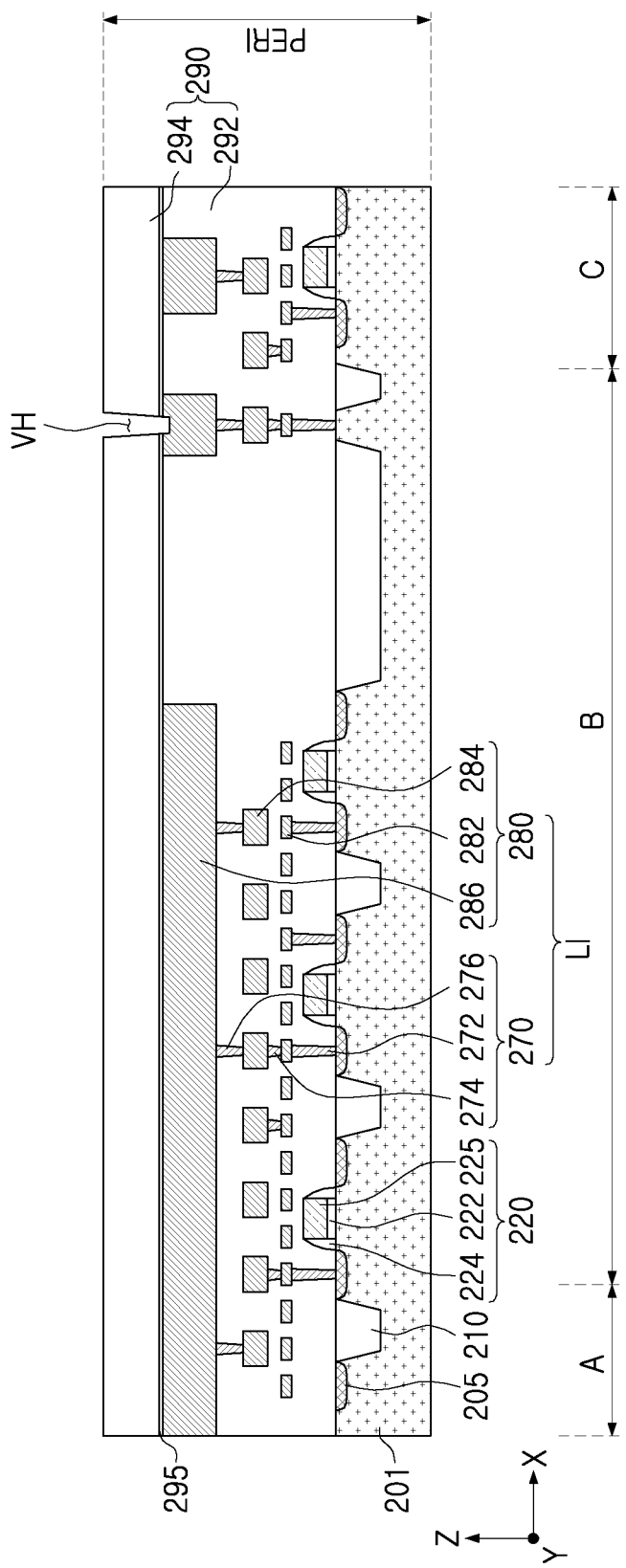

Referring to FIG. 9B, a via hole VH may be formed by forming a second peripheral region insulating layer 294 on the lower protective layer 295, and partially removing the second peripheral region insulating layer 294.

By forming the second peripheral region insulating layer 294, an overall portion of a peripheral circuit region PERI may be formed.

The via hole VH may be a through-hole for forming an upper via GV (see FIG. 1A) of the ground interconnection structure GI. The via hole VH may be formed by removing the second peripheral region insulating layer 294 and the lower protective layer 295 to expose the third lower interconnection line 286 of the lower interconnection structure constituting the ground interconnection structure GI using a mask layer. In example embodiments, the lower protective layer 295 may also function as an etching stop layer when the via hole VH is formed. The via hole VH may be formed to partially recess the third lower interconnection line 286, but the invention is not limited thereto. For example, the via hole VH may be formed to expose an upper surface of the third lower interconnection line 286.

Figure 9C:
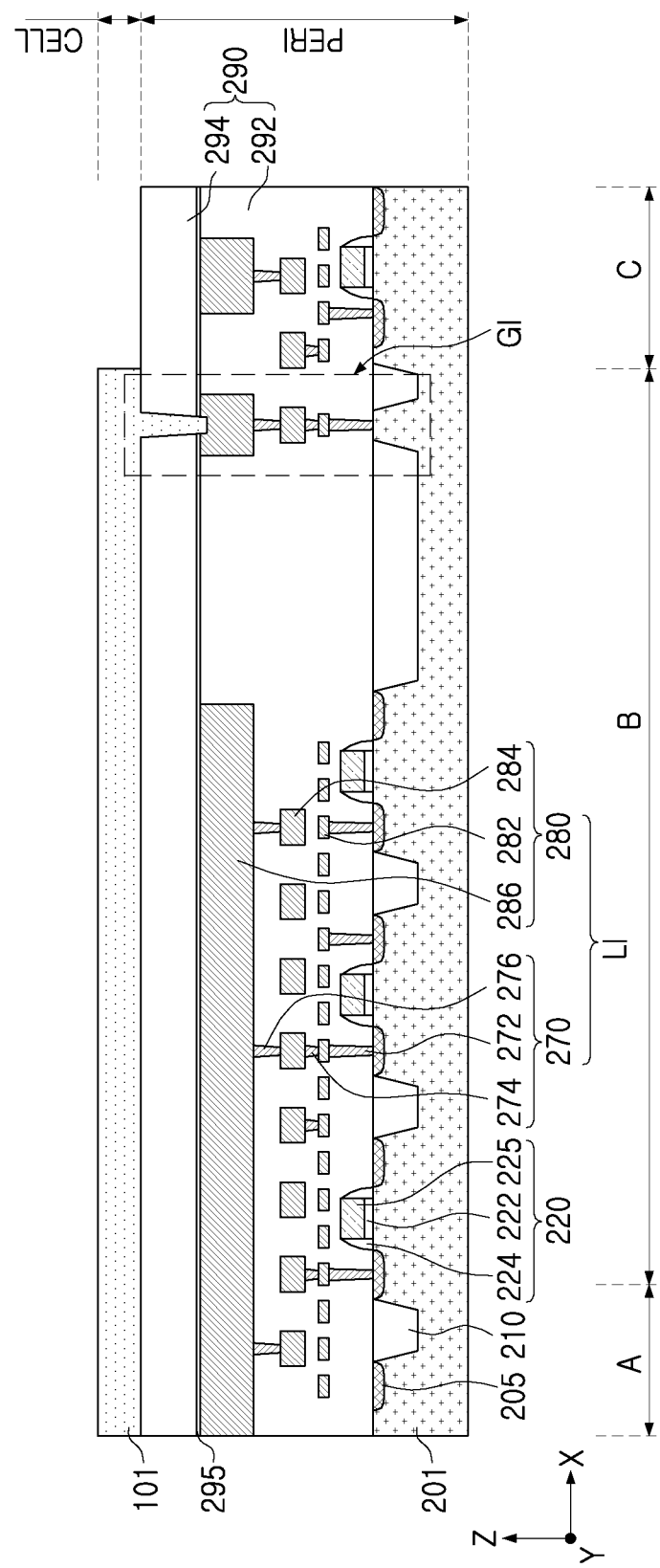

Referring to FIG. 9C, the second substrate 101 of a memory cell region CELL and the upper via GV of the ground interconnection structure GI may be formed on an upper portion of the peripheral circuit region PERI.

Before the second substrate 101 is formed, a barrier layer 103 illustrated in FIG. 2A may be formed on the second peripheral region insulating layer 294. The second substrate 101 may be formed of polycrystalline silicon, for example, and may be formed by a CVD process. When the second substrate 101 is formed, a material forming the second substrate 101 may fill the via hole VH such that the upper via GV may be formed. The polycrystalline silicon forming the second substrate 101 may include impurities such as n-type impurities, for example. The second substrate 101 may be formed on an overall portion of the second peripheral region insulating layer 294, may be patterned, and may be removed from a partial region of the memory cell region CELL including a third region C. The barrier layer 103 disposed on a lower portion of the second substrate 101 may also be removed from the region from which the second substrate 101 is removed.

In example embodiments, before each of the barrier layer 103 and the second substrate 101 is formed, a process of removing a natural oxide film by performing a cleaning process may further be performed. Accordingly, the natural oxide film may rarely remain on an upper portion and a lower portion of the barrier layer 103, or may remain in a thickness of about 20 Å or less. However, in some example embodiments, when the cleaning process is omitted, the natural oxide film may be present on a lower surface and/or an upper surface of the barrier layer 103.

Also, in example embodiments, after the second substrate 101 is formed, a planarization process may further be performed. In this case, the second substrate 101 may have a substantially planar upper surface. In the example embodiment illustrated in FIG. 4, such a planarization process may be omitted.

Figure 9D:
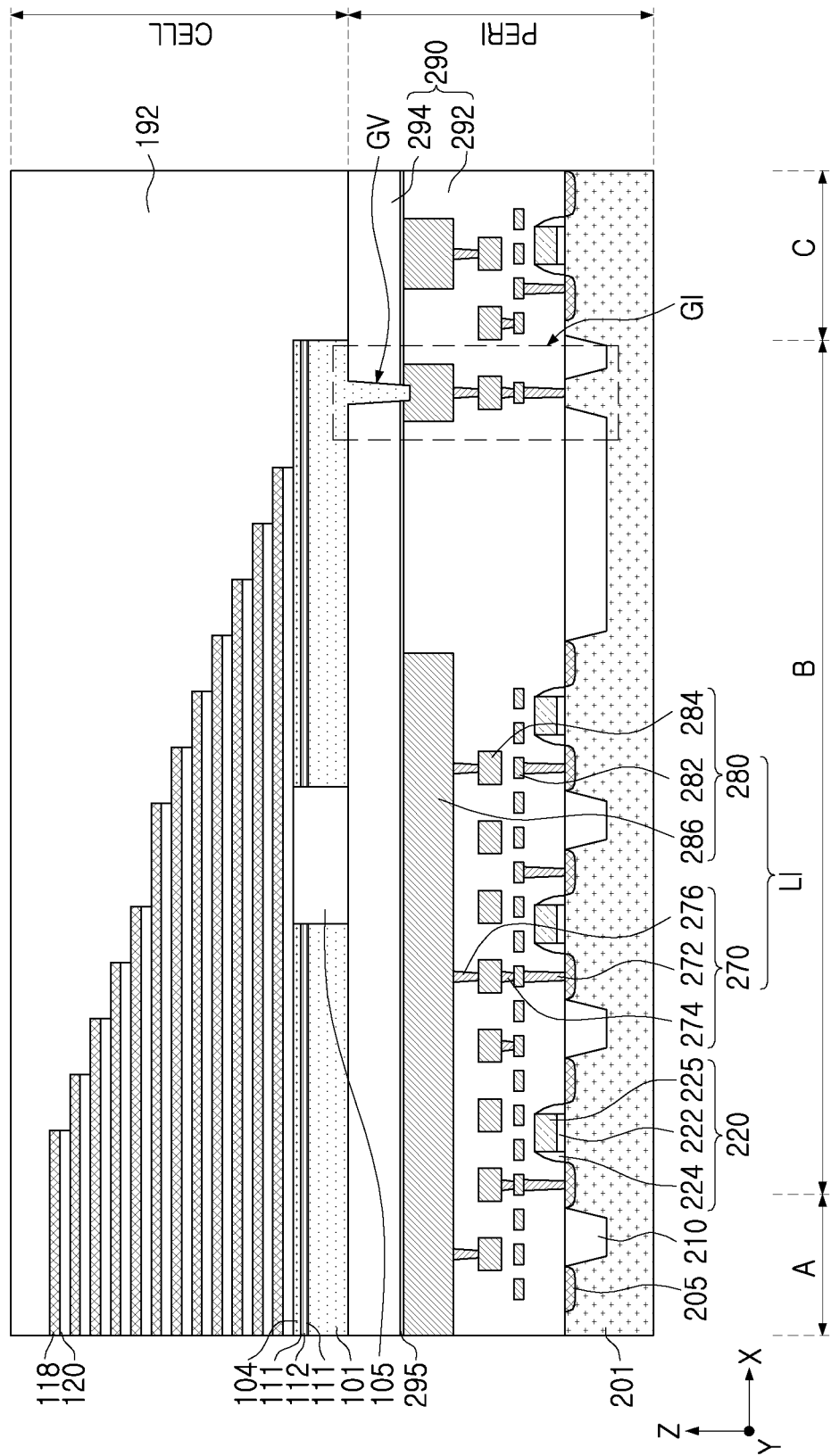

Referring to FIG. 9D, first and second source sacrificial layers 111 and 112 and a second horizontal conductive layer 104 may be formed, a substrate insulating layer 105 may be formed, and thereafter, sacrificial insulating layers 118 and interlayer insulating layers 120 may be alternately stacked.

The first and second source sacrificial layers 111 and 112 may be stacked on the second substrate 101 such that the first source sacrificial layers 111 may be disposed upwardly and downwardly of the second source sacrificial layers 112. The first and second source sacrificial layers 111 and 112 may include different materials. The first and second source sacrificial layers 111 and 112 may be replaced with a first horizontal conductive layer 102 illustrated in FIG. 1A through a subsequent process. For example, the first source sacrificial layers 111 may be formed of a material the same as that of the interlayer insulating layers 120, and the second source sacrificial layers 112 may be formed of a material the same as that of the sacrificial insulating layers 118. The second horizontal conductive layer 104 may be formed on the first and second source sacrificial layers 111 and 112.

The substrate insulating layer 105 may be formed by partially removing the first and second source sacrificial layers 111 and 112, the second horizontal conductive layer 104, and the second substrate 101 in a region in which a through interconnection region TR (see FIG. 1A) is disposed, and filling the portions with an insulating material.

The sacrificial insulating layers 118 may be partially replaced with the gate electrodes 130 (see FIG. 1A) through a subsequent process. The sacrificial insulating layers 118 may be formed of a material different from a material of the interlayer insulating layers 120, and may be formed of a material which may be etched with etching selectivity under a certain etching condition with respect to the interlayer insulating layers 120. For example, the interlayer insulating layers 120 may be formed of at least one of silicon oxide and silicon nitride, and the sacrificial insulating layers 118 may be formed of a material selected from among silicon, silicon oxide, silicon carbide, and silicon nitride, which is different from the material of the interlayer insulating layers 120. In example embodiments, thicknesses of the interlayer insulating layers 120 may not be the same. Thicknesses of the interlayer insulating layers 120 and the sacrificial insulating layers 118 and the number of films of the interlayer insulating layers 120 and the sacrificial insulating layers 118 may be varied.

In a second region B, a photolithography process and an etching process may be repeatedly performed on the sacrificial insulating layers 118 using a mask layer such that the sacrificial insulating layers 118 disposed on an upper portion may extend less than the sacrificial insulating layers 118 disposed on a lower portion. Accordingly, the sacrificial insulating layers 118 may form a staircase-shaped stepped structure by a certain unit.

Thereafter, a first cell region insulating layer 192 covering the stack structure of the sacrificial insulating layers 118 and the interlayer insulating layers 120 may be formed.

Figure 9E:
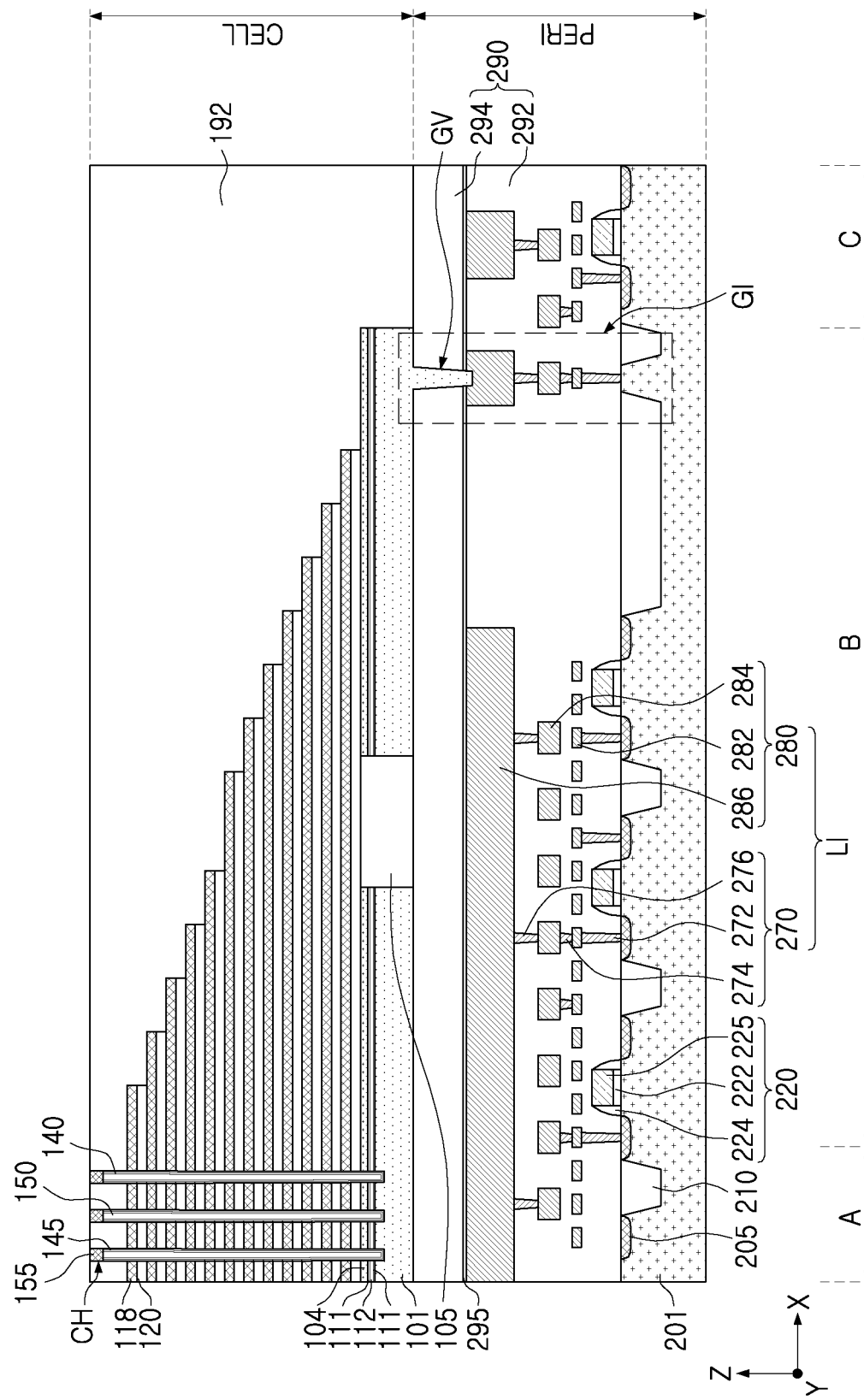

Referring to FIG. 9E, channel structures CH penetrating the stack structure of the sacrificial insulating layers 118 and the interlayer insulating layers 120 may be formed.

Firstly, upper separation regions SS (see FIG. 1B) may be formed by partially removing the sacrificial insulating layers 118 and the interlayer insulating layers 120. The upper separation regions SS may be formed by exposing a region in which the upper separation regions SS are to be formed using a mask layer, removing a certain number of the sacrificial insulating layers 118 and the interlayer insulating layers 120 from an uppermost portion, and depositing an insulating material.

The channel structures CH may be formed by anisotropic-etching the sacrificial insulating layers 118 and the interlayer insulating layers 120, and may be formed by forming a hole-shaped channel holes and filling the holes. Due to a height of the stack structure, a side wall of the channel structures CH may not be perpendicular to an upper surface of the second substrate 101. The channel structures CH may be formed to partially recess the second substrate 101. Thereafter, at least a portion of the gate dielectric layer 145, the channel layer 140, the channel insulating layer 150, and the channel pad 155 may be sequentially formed in the channel structures CH.

The gate dielectric layer 145 may be formed to have a uniform thickness using an ALD process or a CVD process. The gate dielectric layer 145 may be entirely or partially formed in this process, and a portion extending perpendicularly to the second substrate 101 along the channel structures CH may be formed in this process. The channel layer 140 may be formed on the gate dielectric layer 145 in the channel structures CH. The channel insulating layer 150 may be formed to fill the channel structures CH, and may be an insulating material. However, in example embodiments, a space between the channel layers 140 may be filled with a conductive material, instead of the channel insulating layer 150. The channel pad 155 may be formed of a conductive material. For example, the channel pad 155 may be formed of polycrystalline silicon.

Figure 9F:
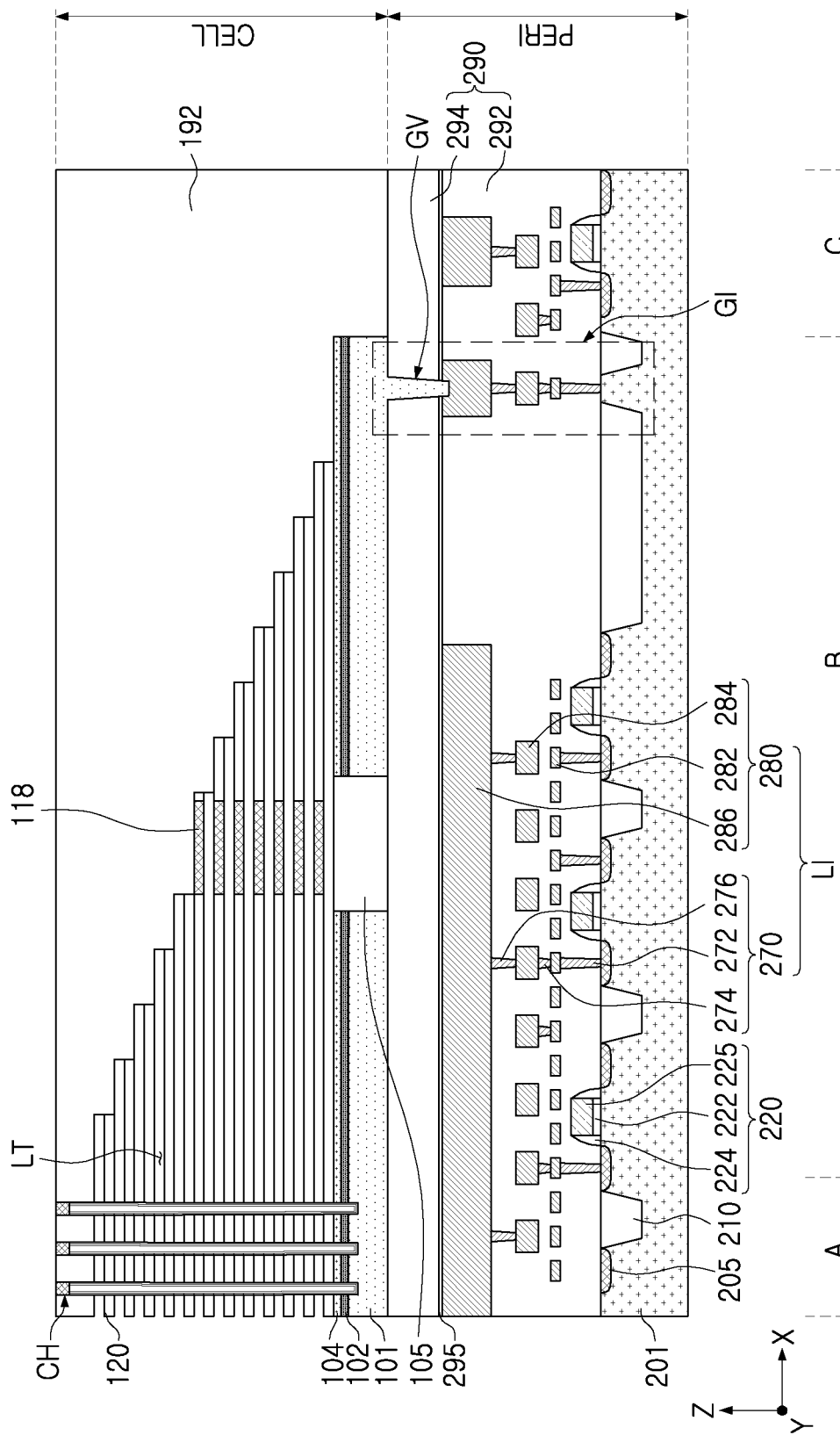

Referring to FIG. 9F, tunnel portions LT may be formed by forming openings penetrating the stack structure of the sacrificial insulating layers 118 and the interlayer insulating layers 120 in regions corresponding to first and second separation regions MS1 and MS2 (see FIG. 1B), and partially removing the sacrificial insulating layers 118 through the openings.

Firstly, sacrificial spacer layers may be formed in the openings, the second source sacrificial layers 112 may be selectively removed, and thereafter, the first source sacrificial layers 111 may be removed. The first and second source sacrificial layers 111 and 112 may be removed by a wet etching process, for example. In the process of removing the first source sacrificial layers 111, a portion of the gate dielectric layer 145 exposed from the region from which the second source sacrificial layers 112 is removed may be removed together. According to example embodiments, a portion of the first and second source sacrificial layers 111 and 112 may remain in the second region B. The first horizontal conductive layer 102 may be formed by depositing a conductive material in a region from which the first and second source sacrificial layers 111 and 112 are removed, and the sacrificial spacer layers may be removed from the openings.

Thereafter, the sacrificial insulating layers 118 may be removed from an external side of the through interconnection region TR (see FIG. 1A). The sacrificial insulating layers 118 may remain in the through interconnection region TR and may form an insulating region of the through interconnection region TR along with the interlayer insulating layers 120. The sacrificial insulating layers 118 may be selectively removed with respect to the interlayer insulating layers 120 using a wet etching process, for example. Accordingly, a plurality of the tunnel portions LT may be formed between the interlayer insulating layers 120.

A region in which the through interconnection region TR is formed may be a region spaced apart from the openings such that the sacrificial insulating layers 118 may remain because an etchant does not reach. Accordingly, the through interconnection region TR may be formed in the center region between the first and second separation regions MS1 and MS2 adjacent to each other.

Figure 9G:
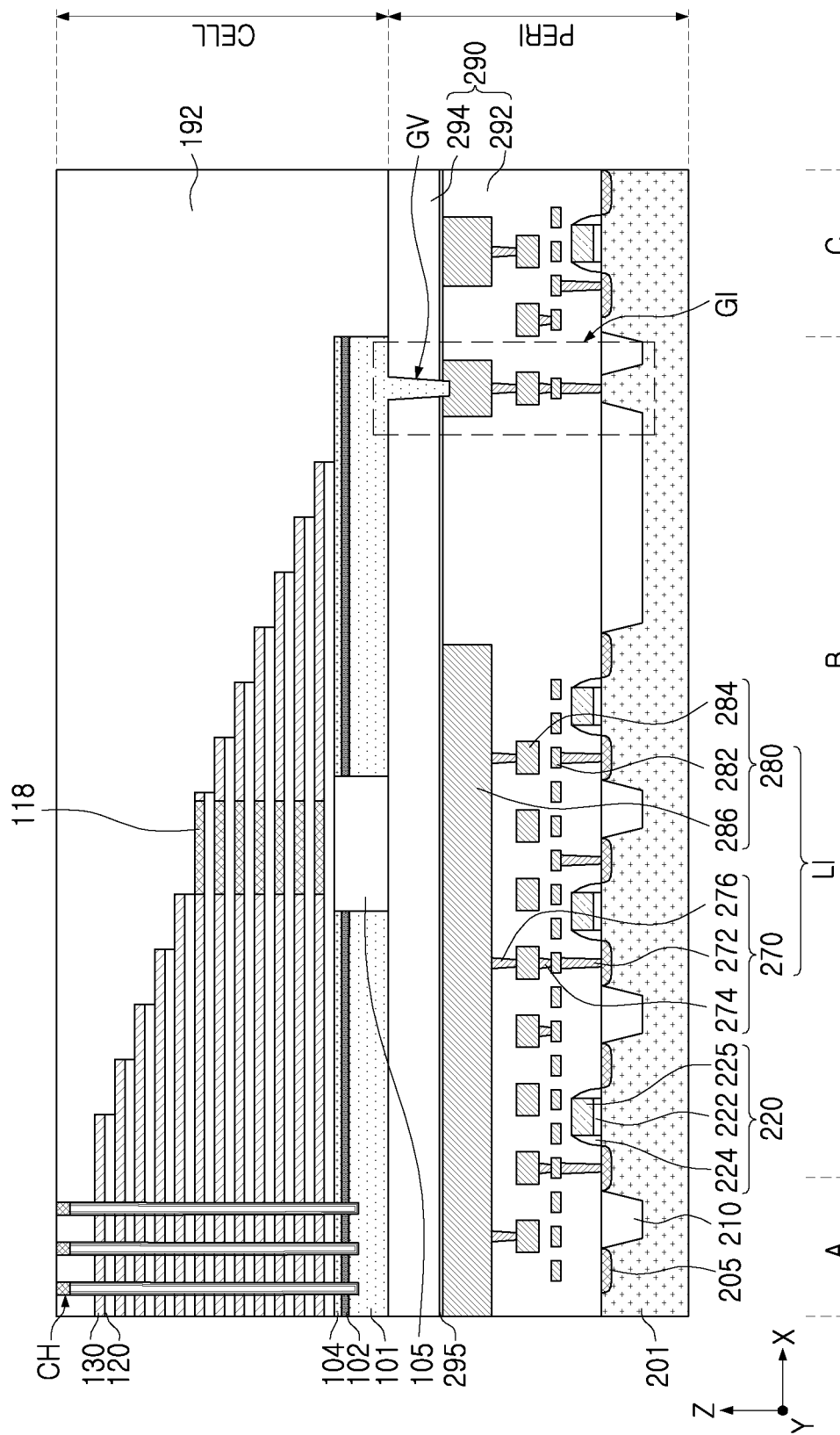

Referring to FIG. 9G, the gate electrodes 130 may be formed by filling the tunnel portions LT from which the sacrificial insulating layers 118 are partially removed with a conductive material. Side surfaces of the gate electrodes 130 may be in contact with side surfaces of the sacrificial insulating layers 118 of the through interconnection region TR. The conductive material may include a metal, polycrystalline silicon, or a metal silicide material. After the gate electrodes 130 are formed, a separation insulating layer 110 (see FIG. 1B) may be formed by removing the conductive material deposited in the openings through an additional process and filling the portion with an insulating layer.

Figure 9H:
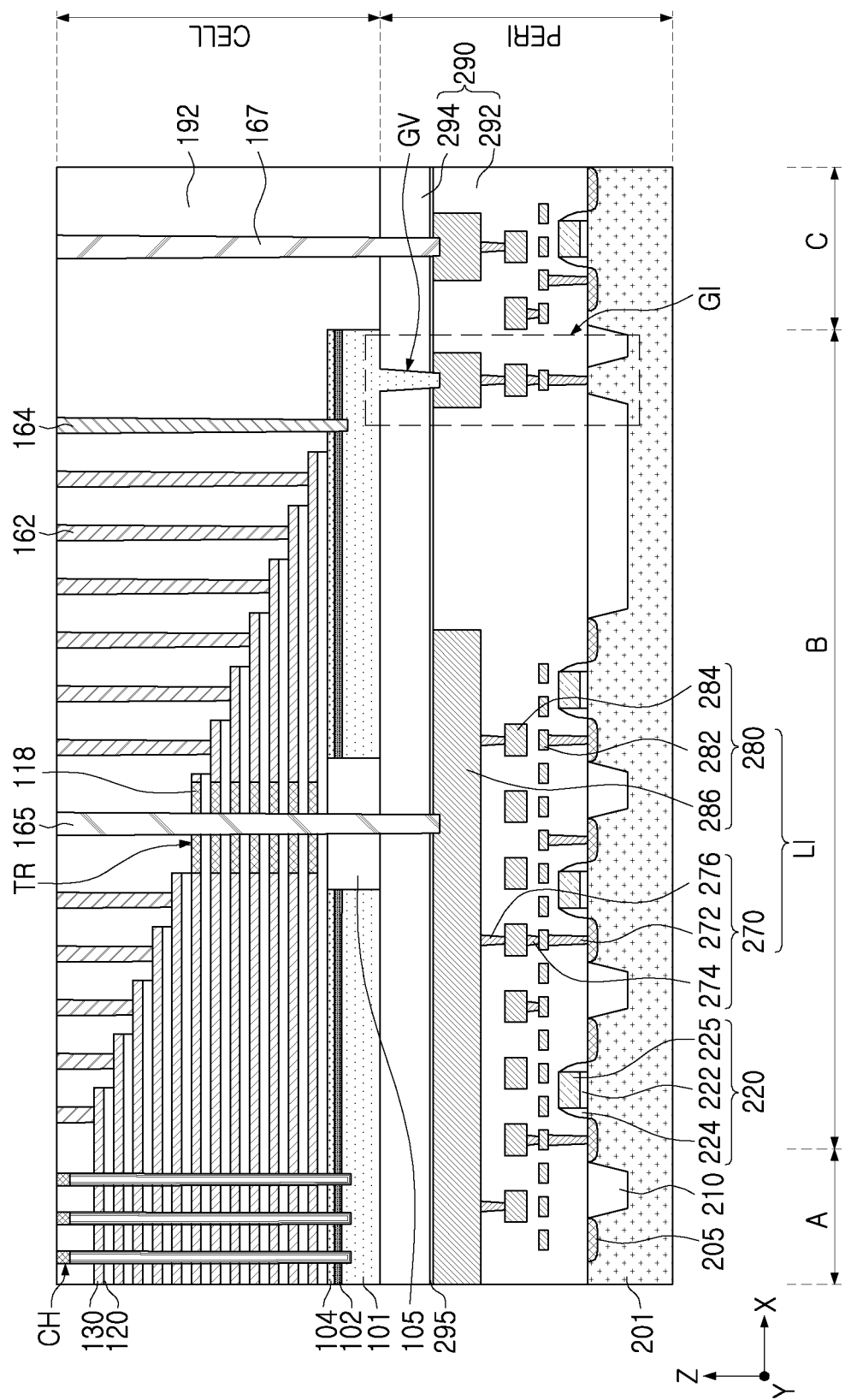

Referring to FIG. 9H, gate contacts 162, a substrate contact 164, and first and second through vias 165 and 167, which penetrate the first cell region insulating layer 192, may be formed.

The gate contacts 162 may be formed to be connected to the gate electrodes 130 in the second region B, and the substrate contact 164 may be formed to be connected to the second substrate 101 on an end of the second region B. The first through via 165 may be formed to be connected to the first interconnection structure LI of the peripheral circuit region PERI in the through interconnection region TR, and the second through via 167 may be formed to be connected to the first interconnection structure LI of the peripheral circuit region PERI in the third region C.

The gate contacts 162, the substrate contact 164, and the first and second through vias 165 and 167 may be formed with different depths, but the gate contacts 162, the substrate contact 164, and the first and second through vias 165 and 167 may be formed by simultaneously forming contact holes using an etching stop layer, or the like, and filling the contact holes with a conductive material. However, in some of example embodiments, a portion of the gate contacts 162, the substrate contact 164, and the first and second through vias 165 and 167 may also be formed in different processes.

Thereafter, referring back to FIG. 1A, a second cell region insulating layer 194, an upper protective layer 195, and an upper interconnection structure UI may be formed.

Upper contact plugs 170 of the upper interconnection structure UI may be formed by partially forming a cell region insulating layer 290, partially removing the cell region insulating layer 290 by an etching process, and filling the portion with a conductive material. Upper interconnection lines 180 may be formed by depositing and patterning a conductive material, for example.

Accordingly, the semiconductor device 100 illustrated in FIGS. 1A to 2B may be manufactured.

According to the aforementioned example embodiments, as the ground interconnection structure includes an upper via extending from the second substrate, a semiconductor device having improved reliability may be provided.

While the example embodiments have been shown and described above, it will be apparent to those skilled in the art that modifications and variations could be made without departing from the scope of the present inventive concept as defined by the appended claims.

What is claimed is:

1. A semiconductor device, comprising:
   a peripheral circuit region including
      a first substrate,
      circuit devices provided on the first substrate, and
      a first interconnection structure electrically connected to the circuit devices;
   a memory cell region including
      a second substrate disposed on an upper portion of the first substrate and having a first region and a second region,
      gate electrodes spaced apart from each other and stacked in a first direction perpendicular to an upper surface of the second substrate in the first region and extending while having a staircase form in a second direction perpendicular to the first direction in the second region,
      interlayer insulating layers alternately stacked with the gate electrodes,
      channel structures penetrating the gate electrodes, extending in the first direction, and including a channel layer, and
      a second interconnection structure electrically connected to the gate electrodes and the channel structures; and
   a third interconnection structure connecting the first substrate and the second substrate, the third interconnection structure including
      an upper via formed of the same layer as the second substrate and extending from the second substrate, the upper via including a material the same as a material of the second substrate, and
      a lower interconnection structure connected to a lower portion of the upper via and having a structure corresponding to the first interconnection structure.

2. The semiconductor device of claim 1, wherein the upper via includes a semiconductor material, and a region of the lower interconnection structure in contact with the upper via includes a metal material.

3. The semiconductor device of claim 1,
   wherein the first interconnection structure and the lower interconnection structure each includes a contact plug and an interconnection line disposed on the contact plug, and
   wherein the upper via is connected to the interconnection line included in the lower interconnection structure.

4. The semiconductor device of claim 1, wherein the upper via includes:
   a barrier layer covering a bottom surface of a via hole; and
   a semiconductor layer disposed on the barrier layer, extending from the second substrate, and filling the via hole.

5. The semiconductor device of claim 4, wherein the barrier layer extends from a lower surface of the second substrate to the bottom surface of the via hole along an internal side wall of the via hole.

6. The semiconductor device of claim 4, wherein the barrier layer covers an internal side wall and the bottom surface of the via hole and is limitedly disposed in the via hole.

7. The semiconductor device of claim 4, wherein the barrier layer is formed of a metal nitride.

8. The semiconductor device of claim 1, wherein the upper via has a height in a range of about 3000 Å to about 5000 Å in the first direction.

9. The semiconductor device of claim 1, wherein the upper via has a diameter in a range of about 200 nm to about 300 nm.

10. The semiconductor device of claim 1, wherein the second substrate has a recessed portion on the upper surface, the recessed portion aligned in the first direction with the upper via.

11. The semiconductor device of claim 1, wherein the third interconnection structure is disposed on an external side of ends of the gate electrodes.

12. The semiconductor device of claim 1, further comprising:
   at least one horizontal conductive layer disposed on the second substrate horizontally on a lower portion of the gate electrodes and the interlayer insulating layers and in contact with the channel layer.

13. The semiconductor device of claim 12, wherein the third interconnection structure is disposed on a lower portion of the horizontal conductive layer in a region in which the horizontal conductive layer extends further than the gate electrodes in the second direction.

14. The semiconductor device of claim 1, wherein the upper via is one of a plurality of upper vias of the third interconnection structure, the plurality of upper vias have the same structure and are disposed side by side with each other.

15. A semiconductor device, comprising:
   a first substrate;
   circuit devices disposed on the first substrate;
   a first interconnection structure electrically connected to the circuit devices;
   a second substrate disposed on an upper portion of the first interconnection structure;
   gate electrodes spaced apart from each other and stacked on the second substrate in a direction perpendicular to an upper surface of the second substrate;
   channel structures penetrating the gate electrodes, extending perpendicularly to the second substrate, and including a channel layer; and
   a ground interconnection structure connecting the first substrate and the second substrate, and including an upper via formed of the same layer as the second substrate and extending from a lower surface of the second substrate towards the first substrate.

16. The semiconductor device of claim 15, wherein the ground interconnection structure further includes a lower interconnection structure connected to a lower portion of the upper via and having a structure corresponding to the first interconnection structure.

17. The semiconductor device of claim 15, wherein the ground interconnection structure further includes a lower interconnection structure connected to a lower portion of the upper via and having a structure corresponding to a portion of the first interconnection structure.

18. The semiconductor device of claim 15, further comprising:
   a protective layer disposed to be parallel to an upper surface of the first substrate on the first interconnection structure,
   wherein the upper via penetrates the protective layer.

19. A semiconductor device, comprising:
   a first region including
      a first substrate,
      circuit devices provided on the first substrate, and
      a first interconnection structure electrically connected to the circuit devices;
   a second region including
      a second substrate disposed on an upper portion of the first substrate and including a semiconductor material,
      gate electrodes spaced apart from each other and stacked on the second substrate in a direction perpendicular to an upper surface of the second substrate,
      channel structures penetrating the gate electrodes, extending perpendicularly to the second substrate, and including a channel layer, and
      a second interconnection structure electrically connected to the gate electrodes and the channel structures; and
   a third interconnection structure connecting the first substrate and the second substrate, the third interconnection structure including
      an upper via formed of the same layer as the second substrate, and
      a metal structure connected to the upper via.

20. The semiconductor device of claim 19, further comprising:
   a through-via penetrating the gate electrodes and a substrate insulating layer disposed on a lower portion of the gate electrodes, and connecting the first interconnection structure and the second interconnection structure,
   wherein the upper via includes a semiconductor layer, and the through-via includes a metal layer.

21. The semiconductor device of claim 1, wherein the upper via merges with the second substrate at a bottom of the second substrate and there is another layer contacting the uppermost surface of the second substrate directly above the upper via and the uppermost surface of the second substrate is below the gate electrodes.

22. The semiconductor device of claim 1, wherein, with respect to a cross sectional view, the second substrate contiguously extends in the second direction directly over the upper via.

23. The semiconductor device of claim 15, wherein the upper via merges with the second substrate at a bottom of the second substrate and there is another layer contacting the uppermost surface of the second substrate directly above the upper via and the uppermost surface of the second substrate is below the gate electrodes.

24. The semiconductor device of claim 15, wherein, with respect to a cross sectional view, the substrate contiguously extends in a horizontal direction directly over the upper via.

25. The semiconductor device of claim 19, wherein the upper via merges with the second substrate at a bottom of the second substrate and there is another layer contacting the uppermost surface of the second substrate directly above the upper via and the uppermost surface of the second substrate is below the gate electrodes.

26. The semiconductor device of claim 19, wherein, with respect to a cross sectional view, the substrate contiguously extends in a horizontal direction directly over the upper via.

* * * * *